US012548732B2

(12) United States Patent
Potocek et al.

(10) Patent No.: US 12,548,732 B2
(45) Date of Patent: Feb. 10, 2026

(54) APPLICATION MANAGEMENT FOR CHARGED PARTICLE MICROSCOPE DEVICES

(71) Applicant: FEI Company, Hillsboro, OR (US)

(72) Inventors: Pavel Potocek, Eindhoven (NL); Maurice Peemen, Rijsbergen (NL); Remco Schoenmakers, Best (NL)

(73) Assignee: FEI Company, Hillsboro, OR (US)

( * ) Notice: Subject to any disclaimer, the term of this patent is extended or adjusted under 35 U.S.C. 154(b) by 646 days.

(21) Appl. No.: 17/823,669

(22) Filed: Aug. 31, 2022

(65) Prior Publication Data

US 2024/0071717 A1 Feb. 29, 2024

(51) Int. Cl.
*H01J 37/26* (2006.01)
*H01J 37/28* (2006.01)

(52) U.S. Cl.
CPC ............ *H01J 37/265* (2013.01); *H01J 37/28* (2013.01); *H01J 2237/31745* (2013.01)

(58) Field of Classification Search
CPC .. H01J 37/00; H01J 37/02; H01J 37/26; H01J 37/28; H01J 37/22; H01J 37/222; H01J 37/265; H01J 2237/31745; H04L 67/125; H04L 67/303
USPC ................................ 250/306, 307, 310, 311
See application file for complete search history.

(56) References Cited

U.S. PATENT DOCUMENTS

2017/0054987 A1* 2/2017 Rangarajan ......... H04L 67/1001
2021/0066032 A1* 3/2021 Kuijper .................. H01J 37/22

OTHER PUBLICATIONS

Extended European Search Report issued in European Patent Application No. 23191711.3, mailed Feb. 2, 2024.

* cited by examiner

*Primary Examiner* — Jason L McCormack
(74) *Attorney, Agent, or Firm* — BakerHostetler

(57) ABSTRACT

Disclosed herein are scientific instrument support systems, as well as related methods, computing devices, and computer-readable media. For example, in some embodiments, an example method may comprise receiving, by a first device located at a premises and from a second device located external to the premises, and via a network, configuration data for a charged particle microscope located at the premises. The method may comprise updating, by the first device and based on the configuration data, one or more configuration settings associated with the charged particle microscope. The method may comprise causing, based on the updated one or more configuration settings, one or more operations associated with the charged particle microscope to be performed.

17 Claims, 9 Drawing Sheets

APPLICATION MANAGEMENT FOR CHARGED PARTICLE MICROSCOPE DEVICES

BACKGROUND

Microscopy is the technical field of using microscopes to better view objects that are difficult to see with the naked eye. Different branches of microscopy include, for example, optical microscopy, charged particle (e.g., electron and/or ion) microscopy, and scanning probe microscopy. Charged particle microscopy involves using a beam of accelerated charged particles as a source of illumination. Types of charged particle microscopy include, for example, transmission electron microscopy, scanning electron microscopy, scanning transmission electron microscopy, and ion beam microscopy.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
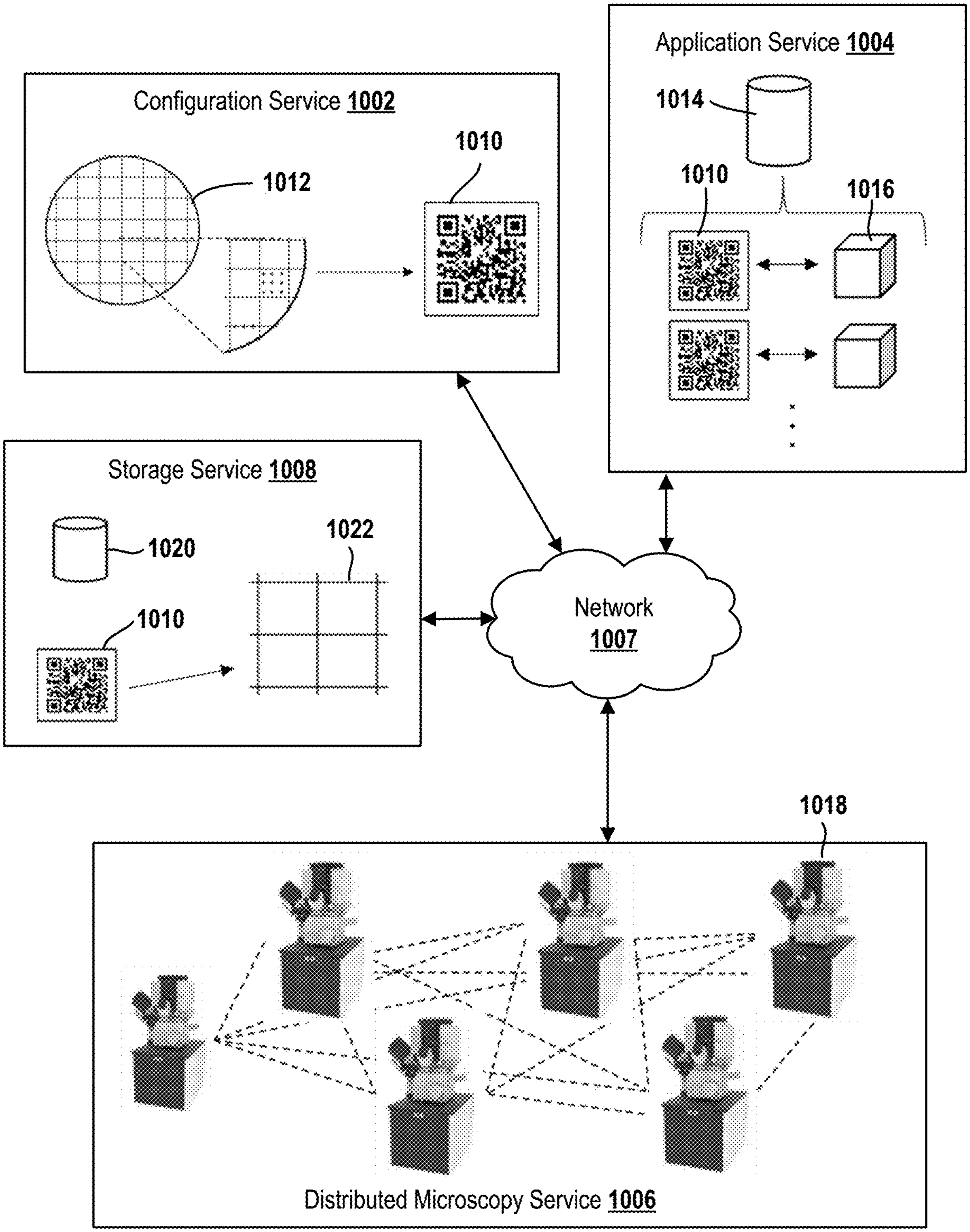
FIG. 1A is a diagram of an example system for performing support operations for one or more scientific instruments, in accordance with various embodiments.

Disclosed herein are scientific instrument support systems, as well as related methods, computing devices, and computer-readable media. For example, in some embodiments, a method may comprise determining, by a first device, an identifier associated with a sample. The method may comprise sending, to a second device, a request comprising the identifier, wherein the second device is configured to determine application data based on the identifier. The method may comprise receiving, based on the request, the application data. The method may comprise causing, based on the application data, a charged particle microscope to process the sample.

Another example method may comprise receiving, by a first device located at a premises and from a second device located external to the premises, and via a network, configuration data for a charged particle microscope located at the premises. The method may comprise updating, by the first device and based on the configuration data, one or more configuration settings associated with the charged particle microscope. The method may comprise causing, based on the updated one or more configuration settings, one or more operations associated with the charged particle microscope to be performed.

Another example method may comprise receiving, by a first device, an identifier associated with a sample. The method may comprise receiving application data for processing the sample. The method may comprise determining an association of the application data and the identifier. The method may comprise sending, to a second device, the application data, the identifier, and data indicative of the association. The second device may be configured to provide, based on the identifier, access to the application data to configure a charged particle microscope to analyze the sample.

The embodiments disclosed herein thus provide improvements to scientific instrument technology (e.g., improvements in the computer technology supporting CPM, among other improvements). The scientific instrument (e.g., CPM) support embodiments disclosed herein may achieve improved performance relative to conventional approaches. For example, conventional CPM imaging (e.g., or other scientific operation) of a large number of samples requires an extensive amount of work at a single location. Additionally, traditional CPM devices are not easily configurable and require, for example, a user to enter in settings on site. Such a process would not be practical or possible for a distributed microscopy system, as each individual device may have different hardware, software, and/or other characteristics. The CPM support embodiments disclosed herein may increase the configurability of CPM devices. The CPM support embodiments disclosed herein allow for the use of parallel and/or distributed imaging to improve conventional CPM devices to be able to process a larger number of samples in a shorter amount of time to generate data that is more uniform than is otherwise possible. Thus, the embodiments disclosed herein thus provide improvements to CPM technology (e.g., improvements in the computer technology supporting such CPMs, among other improvements).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the subject matter disclosed herein. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). Although some elements may be referred to in the singular (e.g., "a processing device"), any appropriate elements may be represented by multiple instances of that element, and vice versa. For example, a set of operations described as performed by a processing device may be implemented with different ones of the operations performed by different processing devices.

The description uses the phrases "an embodiment," "various embodiments," and "some embodiments," each of which may refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. As used herein, an "apparatus" may refer to any individual device, collection of devices, part of a device, or collections of parts of devices. The drawings are not necessarily to scale.

Disclosed here are techniques for implementing a network of shareable microscopes (e.g., charged particle microscopes, optical microscopes, other scientific instruments) to acquire large scale data in parallel way.

There is a strong interest in acquiring a large volume of biological samples like brain tissue at high voxel resolution. Using a single multi-beam microscope, processing a large volume of samples could take years. One possibility is to parallelize the acquisition on multiple systems. But there is no institute which could have or buy tens or hundreds of microscopes and use them at one location to accomplish such process.

The disclosed techniques propose configuring existing microscopes to build a network of systems capable of parallel acquisition. When one entity needs to acquire a large volume data, the entity could rent the systems and distribute the samples to a plurality of locations. Software at each of the microscopy locations may be used to automate and/organize the acquisition process so that the parallel acquisition is uniform and results in storage of the resulting data at a centralized location. To achieve such a task, the microscope environment for each of the data acquisitions at each microscope may be unified via software control and analysis. Using the disclosed techniques, the expected acquisition time can be decreased from years to days or weeks, depending on the count of participated microscopes.

A cloud-based framework may be provided, where customers could store their specific applications for the sample image acquisition into software containers. These containers can be associated with a sample identification (sample ID). When customers create series of samples (e.g., brain sections on wafers), the customers may mark each sample with a unique ID. The customers may store these IDs in a server database together with corresponding a corresponding acquisition application stored in a protected container. The IDs may be coupled with real samples either by writing on a connected paper, or by printing the identifier (e.g., a QR or bar code). Sample holders may be directly labeled with the ID to fully automate the sample ID identification at the microscope site. Once the samples are distributed to the rented microscopes, the microscopes automatically find the application container from the server according to the sample ID and download it. After the acquisition from the application container is executed, the resulting acquired data may be sent to a customer storage location (e.g., customer controlled storage) together with the corresponding sample ID. That will enable customer to reconstruct the full acquired data for the complete set of distributed samples.

The process can be re-iterated as the application containers at the server could be updated with different applications and re-connected to appropriate sample IDs. As the application containers may comprise a proprietary customer software, the application containers should be protected for un-authorized access. The microscope software environment may support the download of the application container from the server and execute the application from the container. This also means the microscope interface for these containers may be unified, too.

The application container may be any application encapsulation or container, which could deliver an executable code to the microscope environment in a safe and protected way (e.g., such as a docker container).

The application container may comprise a processing recipe, a python code, an UI, plugin (e.g., MAPS plugin), a full application in a windows docker, and/or anything which is executable at the microscope site.

FIG. 1A is a diagram of a system (e.g., system architecture) for scientific instrument support. The system may comprise a configuration service 1002, an application service 1004, a distributed microscopy service 1006, a storage service 1008, or any combination thereof. In some scenarios, one or more of the configuration service 1002, the application service 1004, the distributed microscopy service 1006, or the storage service 1008 may be implemented as a single service (e.g., or via one single device). The configuration service 1002, the application service 1004, the distributed microscopy service 1006, or the storage service 1008 may each be implemented as one or more computing devices. Any device disclosed herein may be implemented using one or more computing nodes, such as a virtual machines, executed on a single device and/or multiple computing devices.

One or more of the configuration service 1002, the application service 1004, the distributed microscopy service 1006, or the storage service 1008 may be configured to communicate via one or more networks, such as a network 1007 (e.g., a wide area network and/or one or more local area networks). The network 1007 may comprise wired links, wireless links, a combination thereof, and/or the like. The network 1007 may comprise routers, switches, nodes, gateways, servers, modems, and/or the like.

The configuration service 1002 may comprise a service for managing identifiers. The configuration service 1002 may be configured to determine one or more identifiers 1010. The one or more identifiers 1010 may be determined based on a request to use a distributed microscopy service. The one or more identifiers 1010 may comprise codes, bar codes, QR codes, embedded symbol, and/or any other identifier. The one or more identifiers 1010 may be determined by scanning a container 1012. The one or more identifiers 1010 may be printed, etched, embossed, and/or otherwise integrated into or affixed to the container 1012. A user may determine multiple identifiers 1010 by scanning each container that is associated with a batch of samples.

In some scenarios, the one or more identifiers 1010 may be determined by generating the one or more identifiers 1010. The configuration service 1002 may allow a user to select parameters for generating an identifier for one or more samples. The parameters may allow a user to select an algorithm for generating identifiers, a type of identifier, a number of identifiers to generate, and/or the like. The generated identifiers may be printed onto a paper, printed on a label, printed (e.g., etched) onto a container, and/or the like.

The configuration service 1002 may be configured to generate packaging information, such as packaging labels. The configuration service 1002 may be configured to select one or more microscopy sites (e.g., locations, states, individual microscopes, buildings) of the distributed microscopy service 1006. The packaging information may comprise address information for the selected microscopy sites, containers (e.g., or identifiers 1010) to send to each specific microscopy site, and/or the like. The packaging information may comprise a sheet of scannable information (e.g., one or more identifiers 1010), a label to affix to a package, and/or the like.

The application service 1004 may be configured to store the one or more identifiers 1010 determined by the configuration service. The application service 1004 may receive the one or more identifiers 1010 from the configuration service 1002. The application service 1004 may comprise a data store 1014, such as a database. The application service 1004 may store the one or more identifiers 1010 in the data store. The application service 1004 may use the data store 1014 to associate the one or more identifiers 1010 with other data, such as batch data indicating a batch of samples, user account identifiers (e.g., of the user determining the identifiers), configuration data 1016, and/or the like. The configuration data 1016 may comprise data associated with processing the samples. The configuration data 1016 may comprise executable application data, such as a script, application binary, user interface, plugin, widget, and/or the like. The application data may be a package, application container, software image, virtualization container for launching a virtualized operating system (e.g., or virtualized computer), and/or the like. The configuration data 1016 may comprise settings data, such as computer parameters, microscope parameters, timing information, version information, authentication information, privacy settings, storage settings, and/or the like. The configuration data (e.g., the application data) may comprise user instructions, such as instructions for performing an interactive acquisition. The user instructions may comprise one or more steps for operating, configuring, and/or the like microscopy device. For example, the configuration data (e.g., the application data) may comprise a process flow (e.g., or application to implement a process flow) of multiple steps. A step in the process flow may include instructions to a user. A step in the process flow may comprise executing computer readable code. A step in the process flow may comprise user instructions, a dialogue for receiving user input, computer readable code, or any combination thereof. The configuration data may define a sequence of the steps, and/or a multiple sequences of steps in which the next step is determined based on the results of each step. The configuration data may comprise predefined parameters for one or more of the steps. The configuration data may include prompts for user to accept and/or modify the predefined parameters, review acquired images, provide notes for images, and/or the like. The user may upload the configuration data 1016 via user interface and associate the configuration data 1016 with a batch of samples and/or corresponding one or more identifiers 1010 of the batch.

The configuration data may comprise a reference image. The reference image may be compared (e.g., by a user, or automatically based on computer readable code) to an image generated by a microscopy device (e.g., an image of a sample that is part of a batch to process). Parameters of the microscopy device may be updated (e.g., iteratively), until a condition is met for the comparison. When running an experiment over multiple microscopes, this process may require similar acquisition settings at each microscopy such that the total dataset later can be combined without microscope specific artifacts. To achieve this goal even more than only microscope settings can be programmed in the configuration service. Example images can be used that represent the target noise levels. Sometimes a participant has a somewhat different microscope and only raw settings will not help to make the data comparable. In these cases an example image may be used. The microscopy device may be tuned (e.g., by a user and/or automatically by a computing device) until similar quality is achieved.

The distributed microscopy service 1006 may comprise a plurality of microscopy devices 1018, such as charged particle microscopes, optical microscopes, and/or other scientific instrumentation. The plurality of microscopy devices 1018 may be geographically distributed, such as via a plurality of sites, buildings, premises, rooms, and/or the like. Each site may comprise at least one building with one or more microscopy devices. The distributed microscopy service 1006 may include microscopes from one or more entities (e.g., companies, organizations). Each microscopy device 1018 may have an associated computing device, which may be separate from or integrated into the microscopy device 1018. If a user receives a sample from a customer, the user may use the microscopy device 1018 and/or related computing device to determine the one or more identifiers 1010 associated with a particle sample. This may be done by scanning the identifier using a scanner (e.g., handheld scanner), scanning the identifier using the microscopy device 1018, by user input, and/or the like.

The computing device associated with the microscopy device 1018 may send a request to the application service 1004 for any configuration data 1016 associated with the one or more identifiers 1010 associated with the sample. The application server 1004 may query the data store 1014 using the one or more identifiers 1010, and determine any configuration data 1016 associated with the sample. The configuration data 1016 may be sent to the computing device associated with the microscopy device 1018. The computing device associated with the microscopy device 1018 may using the configuration data 1016 to process the sample. Using the configuration data 1016 may comprise loading any application, application container, script and/or the like on the computing device and/or the associated microscopy device 1018. Using the configuration data 1016 may comprise updating settings of the on the computing device and/or the associated microscopy device 1018.

The storage service 1008 may be configured to receive the results of processing performed by the distributed microscopy service 1006. For example, a plurality of different microscopy devices 1018 may each process different samples as part of a batch of samples for a customer. The processing may result in imaging data, reconstructed representations of a sample, analysis results of processing the imaging data, and/or the like. If the configuration data includes privacy settings, then the results may be encrypted and/or otherwise protected. If the configuration data includes accountability settings, then the results may be added as a transaction to a blockchain, and/or other data structure. The transaction may comprise one or more identifiers (e.g., of the sample, of the batch). The transaction may comprise an identifier associated with the entity and/or microscopy used. The transaction may comprise an identifier of the results and/or at least a portion of the result.

The results (e.g., and related information, such as the identifier of the sample) may be sent from each of the microscopy devices 1018 to the storage service 1008. The storage service 1008 may comprise a data structure 1020 (e.g., database). The data structure 1020 may be configured to store the identifier 1010 and associate the identifier with the results stored on the storage service 1008. For example, the results may comprise imaging data 1022 as represented in FIG. 1A. The customer may access the results from all of the different microscopy devices 1018 by using a user interface to access the results on the storage service 1008. For example, a user may be able to search for an identifier, range of identifiers, batch identifiers and/or other details to find all of the results for a particular batch.

Figure 1B:
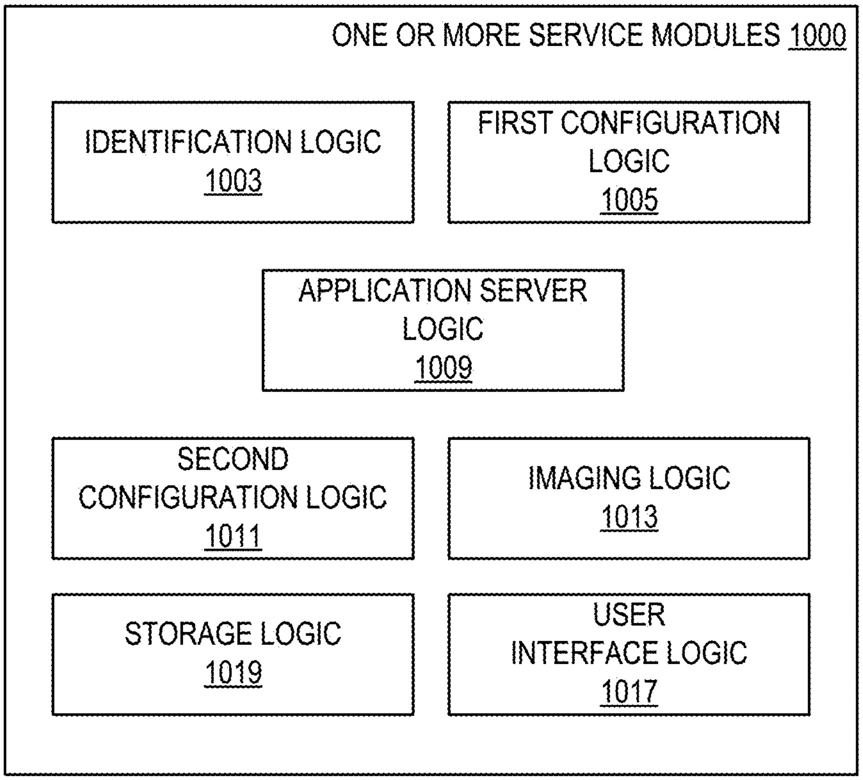
FIG. 1B is a block diagram of an example scientific instrument support module for performing support operations, in accordance with various embodiments.

FIG. 1B is a block diagram of one or more scientific instrument (e.g., microscopy, charged particle microscopy) support modules 1000 for performing support operations, in accordance with various embodiments. The one or more scientific instrument support modules 1000 may be implemented by circuitry (e.g., including electrical and/or optical components), such as one or more programmed computing devices. The logic of the one or more scientific instrument support module 1000 may be included in a single computing device, or may be distributed across multiple computing devices that are in communication with each other as appropriate. Examples of computing devices that may, singly or in combination, implement the scientific instrument support module 1000 are discussed herein with reference to the computing device 4000 of FIG. 4, and examples of systems of interconnected computing devices, in which the scientific instrument support module 1000 may be implemented across one or more of the computing devices, is discussed herein with reference to the scientific instrument support system 5000 of FIG. 5.

The one or more scientific instrument support modules 1000 may include identification logic 1003, first configuration logic 1005, and application server logic 1009, second configuration logic 1011, imaging logic 1013, storage logic 1019, and user interface logic 1017. As used herein, the term "logic" may include an apparatus that is to perform a set of operations associated with the logic. For example, any of the logic elements included in the support module 1000 may be implemented by one or more computing devices programmed with instructions to cause one or more processing devices of the computing devices to perform the associated set of operations. In a particular embodiment, a logic element may include one or more non-transitory computer-readable media having instructions thereon that, when executed by one or more processing devices of one or more computing devices, cause the one or more computing devices to perform the associated set of operations. As used herein, the term "module" may refer to a collection of one or more logic elements that, together, perform a function associated with the module. Different ones of the logic elements in a module may take the same form or may take different forms. For example, some logic in a module may be implemented by a programmed general-purpose processing device, while other logic in a module may be implemented by an application-specific integrated circuit (ASIC). In another example, different ones of the logic elements in a module may be associated with different sets of instructions executed by one or more processing devices. A module may not include all of the logic elements depicted in the associated drawing; for example, a module may include a subset of the logic elements depicted in the associated drawing when that module is to perform a subset of the operations discussed herein with reference to that module.

The identification logic 1003 may receive an identifier associated with a sample. The identification logic 1003 may be configured to receive the identifier associated with the sample by a first device. The identifier may comprise one or more of a scannable code, a bar code, a quick response code, a pattern (e.g., etched, notched, spots, holes, and/or the like on or integrated into the container). The identifier may be one or more of affixed to or integrated into a container of the sample. The container may comprise a microscopy grid container. Receiving the identifier may be based on user input. The user input may comprise one or more of a user scanning the identifier, the user inputting the identifier in a user interface, the user selecting the identifier, or the user pressing a button to cause automated generation of the identifier. Receiving the identifier may comprise receiving the identifier based on an association of the identifier with an order for a container comprising the sample.

The first configuration logic 1005 may receive configuration data (e.g., application data, settings, parameters) for processing the sample. Receiving the configuration data (e.g., application data, settings, parameters) may be based on user input. The user input may comprise one or more of a user inputting at least one command in a script language, the user selecting a prior uploaded configuration data (e.g., application data, settings, parameters) package, or a user uploading a file comprising the configuration data (e.g., application data, settings, parameters). The user input may comprise a user selecting, via a user interface, a sequence of one or more commands and corresponding parameters, wherein the configuration data (e.g., application data, settings, parameters) is generated based on the sequence.

The configuration data (e.g., application data, settings, parameters) may comprise an application container comprising one or more applications. The application container may comprise a container image comprising one or more computer-readable code packages. The application container may comprise a container image comprising an application for performing an operation and one or more application packages relied upon by the application. The application container may comprise a container image configured to virtualize an operating system (e.g., without virtualizing hardware and/or also virtualizing hardware)). The configuration data (e.g., application data, settings, parameters) may comprise one or more of a file, a container, or a script comprising an application. The configuration data (e.g., application data, settings, parameters) may comprise a privacy condition associated with processing the sample. The privacy condition may comprise a condition to one or more of prevent access to imaging data of the sample, encrypt the imaging data, or use credentials to cause storage of the imaging data. The configuration data (e.g., application data, settings, parameters) may comprise computer-readable instructions for causing a transaction indicative of the processing of the sample to be added to a distributed ledger. The transaction may comprise one or more of a time at which processing the sample to generate imaging data occurred, a location of the charged particle microscope, an indication of an identifier associated with an imaged sample, or validation information.

The first configuration logic 1005 may determine an association of the configuration data (e.g., application data, settings, parameters) and the identifier. Determining the association may comprise receiving user input via a user interface associating the configuration data (e.g., application data, settings, parameters) and the identifier. Determining the association may comprise determining the association based on an association of the identifier with an order for one or more of processing a plurality of samples or purchasing a plurality of sample containers.

The first configuration logic 1005 may send the configuration data (e.g., application data, settings, parameters), the identifier, and data indicative of the association. The first configuration logic 1005 may be configured to send the configuration data (e.g., application data, settings, parameters), the identifier, and data indicative of the association to a computing device, and/or computing service. The application server logic 1009 may receive the configuration data (e.g., application data, settings, parameters), the identifier, and data indicative of the association. The application server logic 1009 may cause the configuration data (e.g., application data, settings, parameters), the identifier, and data indicative of the association to be stored for later access. The application server logic 1009 may receive requests for configuration data (e.g., application data, settings, parameters) from a variety of computing devices. For example, a plurality of computing devices geographical distributed at a plurality of premises may each request configuration data (e.g., application data, settings, parameters) as need to process various samples associated with specific identifiers. The computing devices may use the configuration data (e.g., application data, settings, parameters) to configure a corresponding charged particle microscopy device.

The application server logic 1009 may provide, based on the identifier, access to the configuration data (e.g., application data, settings, parameters) to configure a charged particle microscope and/or associated computing device to analyze the sample. The microscope and/or associated computing device device may be one of a plurality of computing devices geographical distributed at a plurality of premises for implementing the service for processing the plurality of samples. The associated computing device may be configured to operate the charged particle microscope or may be a computing device integrated into the charged particle microscope. Sending the configuration data (e.g., application data, settings, parameters), the identifier, and data indicative of the association may comprise causing storage of the configuration data (e.g., application data, settings, parameters), the identifier, and data indicative of the association.

The second configuration logic 1011 may be configured to receive configuration data for a charged particle microscope. The second configuration logic 1011 may be implemented by a computing device located at the same premises as the charged particle microscope. The configuration data may be received from a device implementing the application server logic. The configuration data for the charged particle microscope may be received via a network. Receiving the configuration data may be based on a detection of a triggering condition. The triggering condition may comprise one or more of a scheduled update or a request for the configuration data. The triggering condition may comprise determining (e.g., scanning, inputting) an identifier of a sample for imaging by the charged particle microscope. Determining the identifier may be based on user input. The user input may comprise one or more of a user scanning the identifier, a user inputting the identifier in a user interface, the user selecting the identifier, or the user pressing a button to cause automated generation of the identifier. Determining the identifier may comprise receiving the identifier based on an association of the identifier with an order associated with a container comprising the sample. The triggering condition may comprise determining a type, a characteristic, a pattern, and/or the like of a sample. For example, a specific organ and/or type of tissue may be detected (e.g., based on user input, based on computer automated image analysis), such as brain tissue slices on a tape. The type, characteristic, pattern, and/or the like may be determined (e.g., by the microscopy device, by a related computing device) based on an initial image of a sample. A request may be made (e.g., from a microscopy device of the distributed microscopy service 1006 to an application service 1004) for the configuration data if the triggering condition is detected. In some scenarios, the initial image may be sent to a service, which may analyze the image to determine the type, characteristic, pattern, and/or the like and provide any associated configuration data.

The configuration data may comprise one or more of a parameter setting for operating the charged particle microscope or a command for the charged particle microscope. The configuration data may comprise an application container comprising one or more applications. The application container may comprise a container image comprising one or more computer-readable code packages. The application container may comprise a container image comprising an application for performing an operation and one or more application packages relied upon by the application. The application container may comprise a container image configured to virtualize an operating system. The configuration data may comprise one or more of a file, a container, or a script comprising computer-readable instructions associated with operation of the charged particle microscope. Receiving the configuration data may be based on user input. The user input may comprise one or more of a user inputting at least one command in a script language, the user selecting prior uploaded configuration data, or a user uploading a file comprising the configuration data. The user input may comprise a user selecting, via a user interface, a sequence of one or more commands and corresponding parameters. The configuration data may be generated based on the sequence.

The configuration data may be generated, received, determined, requested, and/or the like based on an initialization process. The initialization process may be a process that is automatically executed upon booting up (e.g., or based on any other triggering condition) a microscopy device and/or related computing device. The initialization process may be initiated by a user. The initialization process may comprise requesting the configuration data. The initialization process may comprise acquiring an image (e.g., of a sample, or a reference object). The acquired image may be sent to a service (e.g., the application service 1004, application server logic 1009, first configuration logic 1005) that may process the image. The configuration data may be determined by the service based on processing the image. For example, a default configuration may be selected if the image matches one or more criteria. The default configuration may be modified (e.g., changing one or more parameters, steps, logic, device settings, timing, resolution, orientation) based on whether the image matches the criteria or not. Various rules, logic, ranges, criteria may be defined for selecting the appropriate parameters, logic, and/or configuration data for a specific microscopy device and/or a specific sample. As an example, if the image does not have sufficient resolution and/or quality for a specific batch of samples, the configuration data may be updated to provide parameters that will result in sufficient resolution and/or quality. In some scenarios, receiving configuration data may be an iterative process. For example, default configuration data may be sent to a microscopy device and/or related computer upon a triggering condition (e.g., scanning identifier). Then, after configuring the microscopy device using the configuration data, an initial image may be acquired and analyzed to determine if the configuration data should be further updated to reach various criteria associated with the batch. The process may be repeated until a condition is satisfied.

The second configuration logic 1011 may be configured to update one or more configuration settings associated with the charged particle microscope (e.g., or other scientific instrument). The second configuration logic 1011 may be configured to update one or more configuration settings associated with the charged particle microscope based on the configuration data. Updating the one or more configuration settings may comprise one or more of processing the configuration data, unpackaging the configuration data, or using the configuration data to generate an application container. Updating the one or more configuration settings may comprise processing instructions in the configuration data to one or more of launch an application environment or execute an application in the application environment. Updating the one or more configuration settings may comprise translating one or more of a command or a parameter in the configuration data to a corresponding command or parameter of an interface associated with the charged particle microscope. Updating the one or more configuration settings may comprise updating a configuration setting of the first device associated with controlling the charged particle microscope. Updating the one or more configuration settings may comprise sending, by the first device, the configuration data to the charged particle microscope.

The imaging logic 1013 may be configured to cause one or more operations associated with the charged particle microscope to be performed. The imaging logic 1013 may be configured to cause one or more operations associated with the charged particle microscope to be performed based on configuration data, application data (e.g., an application, script, user interface, etc.), the updated one or more configuration settings, and/or the like. The one or more operations may comprise generating imaging data based on a sample. The one or more operations may comprise executing an application comprised in the configuration data to cause a sequence of operations. The one or more operations may comprise one or more commands indicated in the configuration data associated with processing a sample.

The one or more operations may comprise processing imaging data of a sample generated by the charged particle microscope. Processing the imaging data may comprise inputting the imaging data to a machine-learning model. Processing the imaging data may comprise analyzing the imaging data and determining a command for the charged particle microscope based on the analysis. Processing the imaging data may comprise sending the imaging data to a storage location external to the premises at which the charged particle microscope is located. Processing the imaging data may comprise causing a transaction indicative of the processing of the sample to be added to on a distributed ledger. The transaction may comprise one or more of a time at which processing the sample to generate imaging data occurred, a location of the charged particle microscope, an indication of an identifier associated with an imaged sample, or validation information. The configuration data may comprise a privacy condition and the one or more operations may comprise processing imaging data of a sample according to the privacy condition. The privacy condition may comprise a condition to one or more of prevent access to the imaging data, encrypt the imaging data, or use credentials to cause storage of the imaging data.

The storage logic 1019 may store data, such as imaging data, the processed imaging data, the distributed ledger transaction, results of processing the imaging data, operational data, the identifier, and/or the like. The storage logic 1019 may cause the data to be stored in a storage site specific to the customer. For example, the customer may provide credentials, uniform resource identifiers, protocol address, protocol to use, and/or the like to send data to a remote storage facility. The storage logic 1019 may process requests to access the stored data, and/or may provide a user interface for accessing, managing, and/or analyzing the stored data.

The user interface logic 1017 may cause display, on a display device, data and/or an interface for managing the data. The displayed data may comprise the identifier, the configuration data, options for editing the data, and/or the like. The displayed data may comprise imaging data (e.g., one or more images) generated by the charged particle microscopy device. The displayed data may comprise the results of processing and/or analyzing the imaging data. The displayed data may comprise information representing a batch of samples processed by different microscopy devices.

Figure 2A:
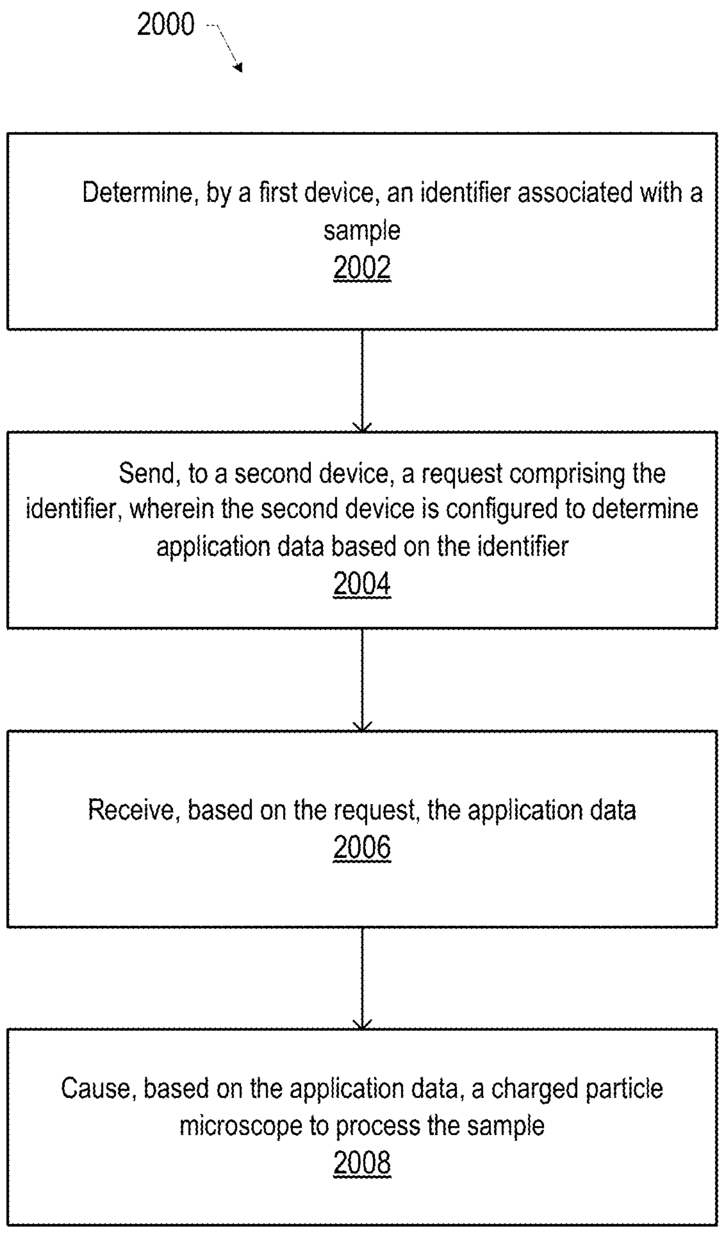
FIG. 2A is a flow diagram of an example method of performing support operations, in accordance with various embodiments.

FIG. 2A is a flow diagram of a method 2000 of performing support operations, in accordance with various embodiments. Although the operations of the method 2000 may be illustrated with reference to particular embodiments disclosed herein (e.g., the scientific instrument support modules 1000 discussed herein with reference to FIG. 1A, the GUI 3000 discussed herein with reference to FIG. 3, the computing devices 4000 discussed herein with reference to FIG. 4, and/or the scientific instrument support system 5000 discussed herein with reference to FIG. 5), the method 2000 may be used in any suitable setting to perform any suitable support operations. Operations are illustrated once each and in a particular order in FIG. 2A, but the operations may be reordered and/or repeated as desired and appropriate (e.g., different operations performed may be performed in parallel, as suitable).

The method 2000 may comprise a computer implemented method for providing a service for automated selection of areas of an image. A system and/or computing environment, such as the scientific instrument support module 1000 of FIG. 1A, the GUI 3000 of FIG. 3, the computing device 4000 of FIG. 4, and/or scientific instrument support system 5000 may be configured to perform the method 2000. For example, any device separately or a combination of devices of the scientific instrument (e.g., the CPM system) 5010, the user local computing device 5020, the service local computing device, and the remote computing device 5040 may perform the method 2000. Any of the features of the methods of FIGS. 2B-2C may be combined with any of the features and/or steps of the method 2000 of FIG. 2A.

At step 2002, an identifier associated with a sample may be determined. The identifier associated with the sample may be determined by a first device. The first device may comprise a computing device of a service for processing a plurality of samples. The first device may be one of a plurality of computing devices geographical distributed at a plurality of premises for implementing the service for processing the plurality of samples. The first device may comprise one or more of a computing device configured to operate the charged particle microscope or a computing device integrated into the charged particle microscope. The identifier may comprise one or more of a scannable code, a bar code, or a quick response code. The identifier may be one or more of affixed to or integrated into a container of the sample. The container may comprise a microscopy grid container. Determining the identifier may be based on user input. The user input may comprise one or more of a user scanning the identifier, the user inputting the identifier in a user interface, or the user selecting the identifier. Determining the identifier may comprise determining the identifier based on an association of the identifier with an order for a container comprising the sample. Determining the identifier may comprise generating an image of at least a portion of the sample with the charged particle microscope and analyzing the image to determine the identifier.

At step 2004, a request comprising the identifier may be sent. The request comprising the identifier may be sent to a second device. The second device is configured to determine application data based on the identifier. The application data may be determined based on an association of the application data and the identifier. The association may be based on user input via a user interface associating the application data and the identifier. The association may be based on an association of the identifier with an order for one or more of processing a plurality of samples or purchasing a plurality of sample containers.

At step 2006, the application data may be received. The application data may be received based on the request. The application data may comprise an application container comprising one or more applications. The application container may comprise a container image comprising one or more computer-readable code packages. The application container may comprise a container image comprising an application for performing an operation and one or more application packages relied upon by the application. The application container may comprise a container image configured to virtualize an operating system. The application data may comprise one or more of a file, a container, or a script comprising an application.

At step 2008, a charged particle microscope may be caused to process the sample. The charged particle microscope may be caused based on the application data to process the sample. Causing the charged particle microscope to process the sample may be performed by the first device. Causing the charged particle microscope to process the sample may comprise one or more of processing the application data, unpackaging the application data, or using the application data to generate an application container. Causing the charged particle microscope to process the sample may comprise processing instructions in the application data to launch an application environment and execute an application in the application environment. The application environment may comprise the container image. Causing the charged particle microscope to process the sample may comprise executing an application comprised in the application data to cause one or more operations. Causing the charged particle microscope to process the sample may comprise causing the charged particle microscope to perform one or more commands indicated in the application data to process the sample. Causing the charged particle microscope to process the sample may comprise causing the charged particle microscope to set one or more operational settings for processing the sample.

Causing the charged particle microscope to process the sample may comprise processing imaging data of the sample generated by the charged particle microscope. Processing the imaging data may comprise inputting the imaging data to a machine-learning model. Processing the imaging data may comprise analyzing the imaging data and determining a command for the charged particle microscope based on the analysis. Processing the imaging data may comprise sending the imaging data to a storage location external to a premises at which the charged particle microscope is located. Processing the imaging data may comprise causing a transaction indicative of the processing of the sample to be added to a distributed ledger. The transaction may comprise one or more of a time at which processing the sample to generate imaging data occurred, a location of the charged particle microscope, an indication of the identifier, or validation information. The application data may comprise a privacy condition and causing the charged particle microscope to process the sample may comprise processing imaging data of the sample according to the privacy condition. The privacy condition may comprise a condition to one or more of prevent access to the imaging data, encrypt the imaging data, or use credentials to cause storage of the imaging data.

Figure 2B:
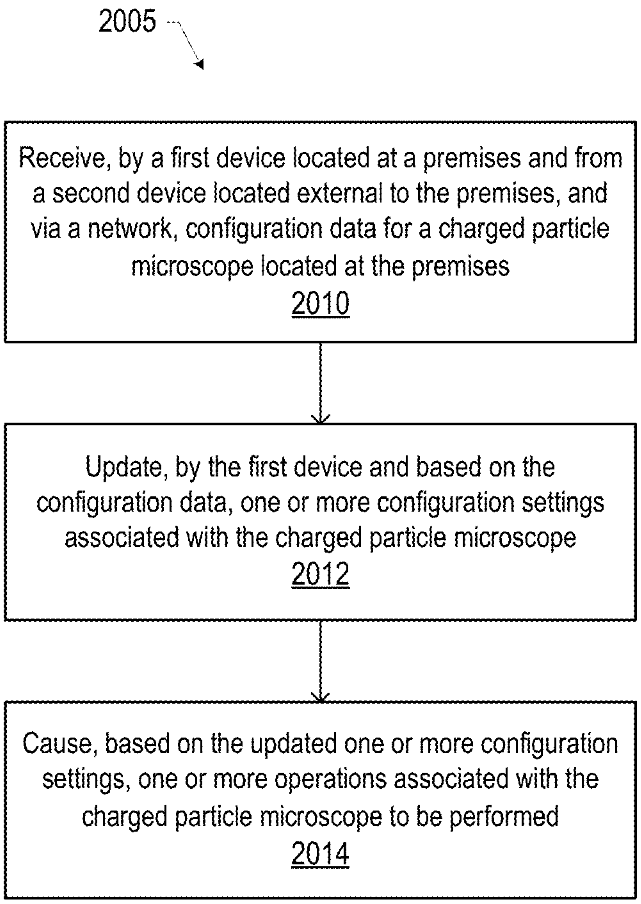
FIG. 2B is a flow diagram of an example method of performing support operations, in accordance with various embodiments.

FIG. 2B is a flow diagram of a method 2005 of performing support operations, in accordance with various embodiments. Although the operations of the method 2005 may be illustrated with reference to particular embodiments disclosed herein (e.g., the scientific instrument support modules 1000 discussed herein with reference to FIG. 1A, the GUI 3000 discussed herein with reference to FIG. 3, the computing devices 4000 discussed herein with reference to FIG. 4, and/or the scientific instrument support system 5000 discussed herein with reference to FIG. 5), the method 2005 may be used in any suitable setting to perform any suitable support operations. Operations are illustrated once each and in a particular order in FIG. 2B, but the operations may be reordered and/or repeated as desired and appropriate (e.g., different operations performed may be performed in parallel, as suitable).

The method 2005 may comprise a computer implemented method for providing a service for automated selection of areas of an image. A system and/or computing environment, such as the scientific instrument support module 1000 of FIG. 1A, the GUI 3000 of FIG. 3, the computing device 4000 of FIG. 4, and/or scientific instrument support system 5000 may be configured to perform the method 2005. For example, any device separately or a combination of devices of the scientific instrument (e.g., the CPM system) 5010, the user local computing device 5020, the service local computing device, and the remote computing device 5040 may perform the method 2005. Any of the features of the methods of FIGS. 2A and 2C may be combined with any of the features and/or steps of the method 2005 of FIG. 2B.

At step 2010, configuration data for a charged particle microscope located at the premises may be received. The configuration data for the charged particle microscope located at the premises may be received by a first device located at a premises. The first device may comprise a computing device of a service for processing a plurality of samples. The first device may be one of a plurality of computing devices geographical distributed at a plurality of premises for implementing the service for processing the plurality of samples. The configuration data for the charged particle microscope located at the premises may be received from a second device located external to the premises. The second device may comprise a server associated with a service for processing a plurality of samples. The configuration data for the charged particle microscope located at the premises may be received via a network. Receiving the configuration data may be based on a detection of a triggering condition. The triggering condition may comprise one or more of a scheduled update or a request for the configuration data. The triggering condition may comprise determining an identifier of a sample for imaging by the charged particle microscope.

The identifier may comprise one or more of a scannable code, a bar code, or a quick response code. The identifier may be one or more of affixed to or integrated into a container of the sample. The container may comprise a microscopy grid container. Determining the identifier may be based on user input. The user input may comprise one or more of a user scanning the identifier, a user inputting the identifier in a user interface, the user selecting the identifier, or the user pressing a button to cause automated generation of the identifier. Determining the identifier may comprise receiving the identifier based on an association of the identifier with an order associated with a container comprising the sample. The configuration data may comprise one or more of a parameter setting for operating the charged particle microscope or a command for the charged particle microscope.

The configuration data may comprise an application container comprising one or more applications. The application container may comprise a container image comprising one or more computer-readable code packages. The application container may comprise a container image comprising an application for performing an operation and one or more application packages relied upon by the application. The application container may comprise a container image configured to virtualize an operating system. The configuration data may comprise one or more of a file, a container, or a script comprising computer-readable instructions associated with operation of the charged particle microscope. Receiving the configuration data may be based on user input. The user input may comprise one or more of a user inputting at least one command in a script language, the user selecting prior uploaded configuration data, or a user uploading a file comprising the configuration data. The user input may comprise a user selecting, via a user interface, a sequence of one or more commands and corresponding parameters, wherein the configuration data is generated based on the sequence.

At step 2012, one or more configuration settings associated with the charged particle microscope may be updated. The one or more configuration settings associated with the charged particle microscope may be updated by the first device. The one or more configuration settings associated with the charged particle microscope may be updated based on the configuration data. Updating the one or more configuration settings may comprise one or more of processing the configuration data, unpackaging the configuration data, or using the configuration data to generate an application container. Updating the one or more configuration settings may comprise processing instructions in the configuration data to one or more of launch an application environment or execute an application in the application environment. Updating the one or more configuration settings may comprise translating one or more of a command or a parameter in the configuration data to a corresponding command or parameter of an interface associated with the charged particle microscope. Updating the one or more configuration settings may comprise updating a configuration setting of the first device associated with controlling the charged particle microscope. Updating the one or more configuration settings may comprise sending, by the first device, the configuration data to the charged particle microscope.

At step 2014, one or more operations associated with the charged particle microscope may be caused to be performed. The one or more operations associated with the charged particle microscope may be caused based on the updated one or more configuration settings. The one or more operations may comprise generating imaging data based on a sample. The one or more operations may comprise executing an application comprised in the configuration data to cause a sequence of operations. The one or more operations may comprise one or more commands indicated in the configuration data associated with processing a sample. The one or more operations may comprise processing imaging data of a sample generated by the charged particle microscope. Processing the imaging data may comprise inputting the imaging data to a machine-learning model. Processing the imaging data may comprise analyzing the imaging data and determining a command for the charged particle microscope based on the analysis.

Processing the imaging data may comprise sending the imaging data to a storage location external to the premises at which the charged particle microscope is located. Processing the imaging data may comprise causing a transaction indicative of the processing of the sample to be added to on a distributed ledger. The transaction may comprise one or more of a time at which processing the sample to generate imaging data occurred, a location of the charged particle microscope, an indication of an identifier associated with an imaged sample, or validation information. The configuration data may comprise a privacy condition and the one or more operations may comprise processing imaging data of a sample according to the privacy condition. The privacy condition may comprise a condition to one or more of prevent access to the imaging data, encrypt the imaging data, or use credentials to cause storage of the imaging data.

Figure 2C:
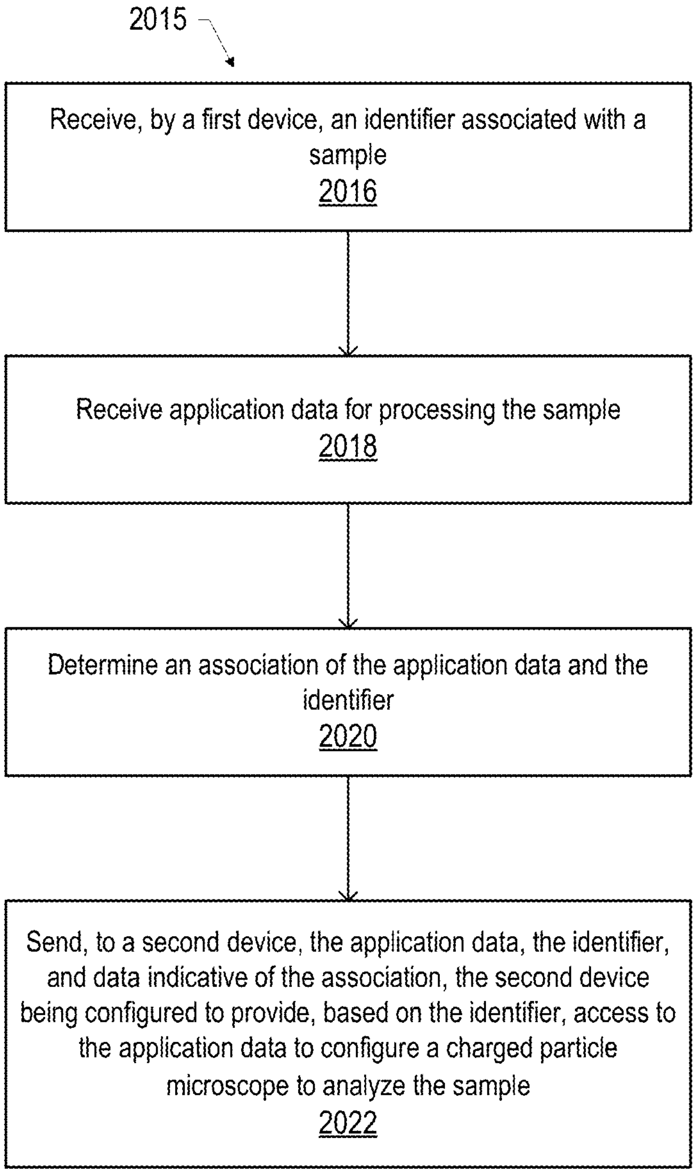
FIG. 2C is a flow diagram of an example method of performing support operations, in accordance with various embodiments.

FIG. 2C is a flow diagram of a method 2015 of performing support operations, in accordance with various embodiments. Although the operations of the method 2015 may be illustrated with reference to particular embodiments disclosed herein (e.g., the scientific instrument support modules 1000 discussed herein with reference to FIG. 1A, the GUI 3000 discussed herein with reference to FIG. 3, the computing devices 4000 discussed herein with reference to FIG. 4, and/or the scientific instrument support system 5000 discussed herein with reference to FIG. 5), the method 2015 may be used in any suitable setting to perform any suitable support operations. Operations are illustrated once each and in a particular order in FIG. 2C, but the operations may be reordered and/or repeated as desired and appropriate (e.g., different operations performed may be performed in parallel, as suitable).

The method 2015 may comprise a computer implemented method for providing a service for automated selection of areas of an image. A system and/or computing environment, such as the scientific instrument support module 1000 of FIG. 1A, the GUI 3000 of FIG. 3, the computing device 4000 of FIG. 4, and/or scientific instrument support system 5000 may be configured to perform the method 2015. For example, any device separately or a combination of devices of the scientific instrument (e.g., the CPM system) 5010, the user local computing device 5020, the service local computing device, and the remote computing device 5040 may perform the method 2015. Any of the features of the methods of FIGS. 2A and 2B may be combined with any of the features and/or steps of the method 2015 of FIG. 2C.

At step 2016, an identifier associated with a sample may be received. The identifier associated with the sample may be received by a first device. The identifier may comprise one or more of a scannable code, a bar code, or a quick response code. The identifier may be one or more of affixed to or integrated into a container of the sample. The container may comprise a microscopy grid container. Receiving the identifier may be based on user input. The user input may comprise one or more of a user scanning the identifier, the user inputting the identifier in a user interface, the user selecting the identifier, or the user pressing a button to cause automated generation of the identifier. Receiving the identifier may comprise receiving the identifier based on an association of the identifier with an order for a container comprising the sample.

At step 2018, application data for processing the sample may be received. Receiving the application data may be based on user input. The user input may comprise one or more of a user inputting at least one command in a script language, the user selecting a prior uploaded application data package, or a user uploading a file comprising the application data. The user input may comprise a user selecting, via a user interface, a sequence of one or more commands and corresponding parameters, wherein the application data is generated based on the sequence. The application data may comprise an application container comprising one or more applications. The application container may comprise a container image comprising one or more computer-readable code packages. The application container may comprise a container image comprising an application for performing an operation and one or more application packages relied upon by the application. The application container may comprise a container image configured to virtualize an operating system. The application data may comprise one or more of a file, a container, or a script comprising an application.

The application data may comprise a privacy condition associated with processing the sample. The privacy condition may comprise a condition to one or more of prevent access to imaging data of the sample, encrypt the imaging data, or use credentials to cause storage of the imaging data. The application data may comprise computer-readable instructions for causing a transaction indicative of the processing of the sample to be added to a distributed ledger. The transaction may comprise one or more of a time at which processing the sample to generate imaging data occurred, a location of the charged particle microscope, an indication of an identifier associated with an imaged sample, or validation information.

At step 2020, an association of the application data and the identifier may be determined. Determining the association may comprise receiving user input via a user interface associating the application data and the identifier. Determining the association may comprise determining the association based on an association of the identifier with an order for one or more of processing a plurality of samples or purchasing a plurality of sample containers.

At step 2022, the application data, the identifier, and data indicative of the association may be sent. The application data, the identifier, and data indicative of the association may be sent to a second device. The second device may be configured to provide, based on the identifier, access to the application data to configure a charged particle microscope to analyze the sample. The second device may comprise a computing device of a service for processing a plurality of samples. The second device may be configured to provide access to the application data to a third device. The third device may be one of a plurality of computing devices geographical distributed at a plurality of premises for implementing the service for processing the plurality of samples. The third device may comprise one or more of a computing device configured to operate the charged particle microscope or a computing device integrated into the charged particle microscope. Sending the application data, the identifier, and data indicative of the association may comprise causing storage of the application data, the identifier, and data indicative of the association.

Figure 4:
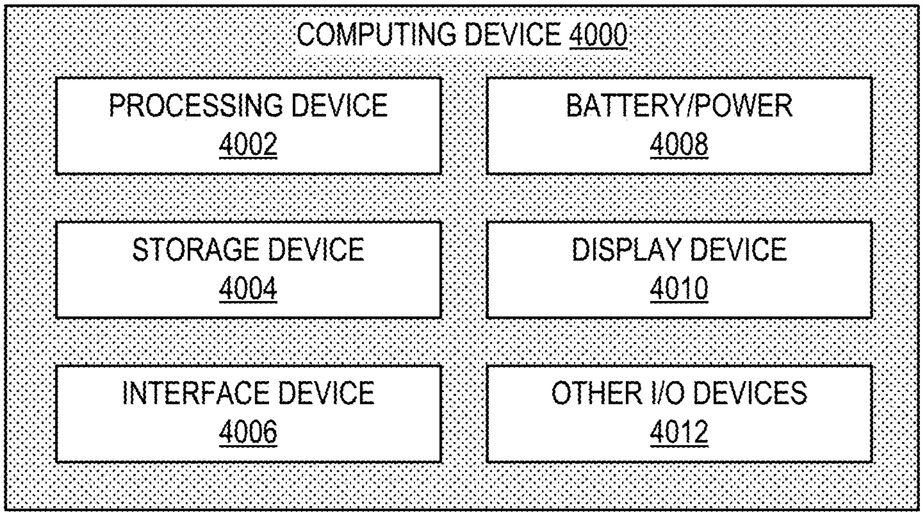
FIG. 4 is a block diagram of an example computing device that may perform some or all of the scientific instrument support methods disclosed herein, in accordance with various embodiments.
Figure 5:
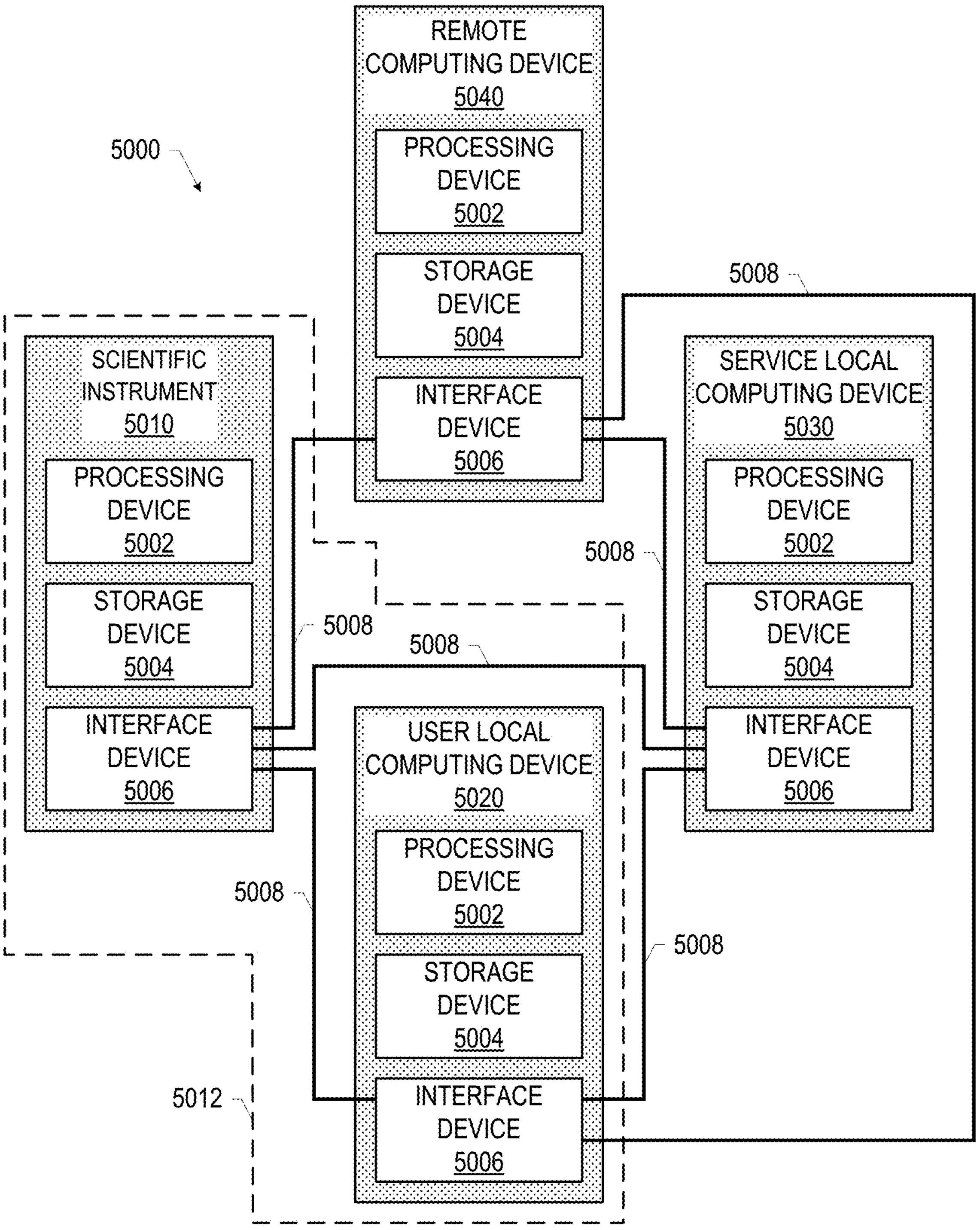
FIG. 5 is a block diagram of an example scientific instrument support system in which some or all of the scientific instrument support methods disclosed herein may be performed, in accordance with various embodiments.

The scientific instrument (e.g., CPM, microscope, or other device) support methods disclosed herein may include interactions with a human user (e.g., via the user local computing device 5020 discussed herein with reference to FIG. 5). These interactions may include providing information to the user (e.g., information regarding the operation of a scientific instrument such as the scientific instrument 5010 (e.g., CPM) of FIG. 5, information regarding a sample being analyzed or other test or measurement performed by a scientific instrument, information retrieved from a local or remote database, or other information) or providing an option for a user to input commands (e.g., to control the operation of a scientific instrument such as the scientific instrument 5010 of FIG. 5, or to control the analysis of data generated by a scientific instrument), queries (e.g., to a local or remote database), or other information. In some embodiments, these interactions may be performed through a graphical user interface (GUI) that includes a visual display on a display device (e.g., the display device 4010 discussed herein with reference to FIG. 4) that provides outputs to the user and/or prompts the user to provide inputs (e.g., via one or more input devices, such as a keyboard, mouse, trackpad, or touchscreen, included in the other I/O devices 4012 discussed herein with reference to FIG. 4). The scientific instrument support systems disclosed herein may include any suitable GUIs for interaction with a user.

Figure 3:
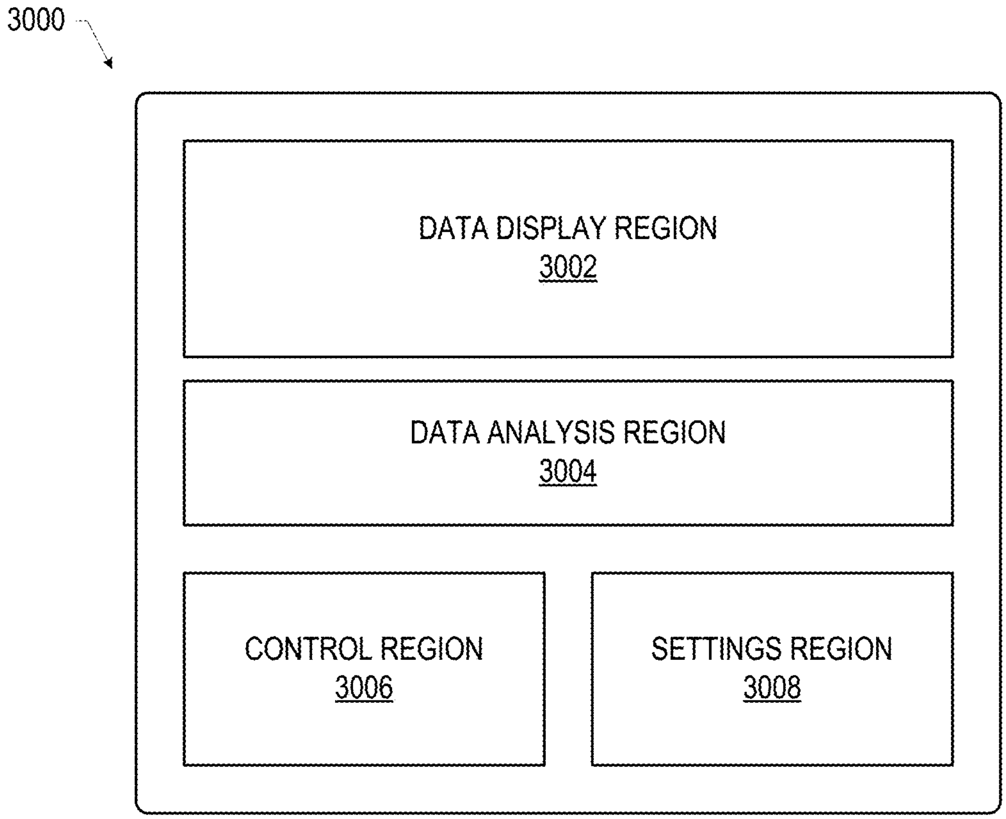
FIG. 3 is an example of a graphical user interface that may be used in the performance of some or all of the support methods disclosed herein, in accordance with various embodiments.

FIG. 3 depicts an example GUI 3000 that may be used in the performance of some or all of the support methods disclosed herein, in accordance with various embodiments. As noted above, the GUI 3000 may be provided on a display device (e.g., the display device 4010 discussed herein with reference to FIG. 4) of a computing device (e.g., the computing device 4000 discussed herein with reference to FIG. 4) of a scientific instrument support system (e.g., the scientific instrument support system 5000 discussed herein with reference to FIG. 5), and a user may interact with the GUI 3000 using any suitable input device (e.g., any of the input devices included in the other I/O devices 4012 discussed herein with reference to FIG. 4) and input technique (e.g., movement of a cursor, motion capture, facial recognition, gesture detection, voice recognition, actuation of buttons, etc.).

The GUI 3000 may include a data display region 3002, a data analysis region 3004, a scientific instrument control region 3006, and a settings region 3008. The particular number and arrangement of regions depicted in FIG. 3 is simply illustrative, and any number and arrangement of regions, including any desired features, may be included in a GUI 3000.

The data display region 3002 may display data generated by a scientific instrument (e.g., the scientific instrument 5010 discussed herein with reference to FIG. 5). For example, the data display region 3002 may display microscopy imaging data generated by the imaging logic 1013. The data display region 3002 may display imaging data and/or other results from a plurality of scientific instruments, such as the those in the distributed microscopy service 1006.

The data analysis region 3004 may display the results of data analysis (e.g., the results of acquiring and/or analyzing the data illustrated in the data display region 3002 and/or other data). The data analysis may be performed based configuration data, application data, and/or settings data used to configure a scientific instrument and/or a computing device associated with the scientific instrument.

The data analysis region 3004 may comprise results of additional analysis performed across an entire batch. For example, in some scenarios, a UI associated with the storage service 1008 may be configured to access application data for processing a plurality of results of imaging. The application data may identify patterns, perform statistical analysis, combine results from individual samples, and/or the like.

The scientific instrument control region 3006 may include options that allow the user to control a scientific instrument (e.g., the scientific instrument 5010 discussed herein with reference to FIG. 5). For example, the scientific instrument control region 3006 may include user-selectable options to cause imaging of a sample, open an application to process the sample, and/or the like.

The settings region 3008 may include options that allow the user to control the features and functions of the GUI 3000 (and/or other GUIs) and/or perform common computing operations with respect to the data display region 3002 and data analysis region 3004 (e.g., saving data on a storage device, such as the storage device 4004 discussed herein with reference to FIG. 4, sending data to another user, labeling data, etc.). For example, the settings region 3008 may include options for managing, selecting, requesting, and/or the like configuration data, such as application data, settings data, and/or the like as described further herein. The user may input an identifier of a sample by scanning (e.g., with a scanning device) the identifier, using the scientific instrument to generate an image of the sample and processing the image to determine the identifier, and/or manually inputting the identifier via a keyboard device. The settings region 3008 may include an option to request the configuration data. The settings region may include an option to mount, load, executable, enable, and/or the like the configuration data, such as loading an application container with an application to use for processing (e.g., controlling the scientific instrument to generate data, analyzing the data, encrypting the data, generating a blockchain transaction based on the data, causing the data to be stored at another location)

As noted above, the scientific instrument support module 1000 may be implemented by one or more computing devices. FIG. 4 is a block diagram of a computing device 4000 that may perform some or all of the scientific instrument support methods disclosed herein, in accordance with various embodiments. In some embodiments, the scientific instrument support module 1000 may be implemented by a single computing device 4000 or by multiple computing devices 4000. Further, as discussed below, a computing device 4000 (or multiple computing devices 4000) that implements the scientific instrument support module 1000 may be part of one or more of the scientific instrument 5010, the user local computing device 5020, the service local computing device 5030, or the remote computing device 5040 of FIG. 5.

The computing device 4000 of FIG. 4 is illustrated as having a number of components, but any one or more of these components may be omitted or duplicated, as suitable for the application and setting. In some embodiments, some or all of the components included in the computing device 4000 may be attached to one or more motherboards and enclosed in a housing (e.g., including plastic, metal, and/or other materials). In some embodiments, some these components may be fabricated onto a single system-on-a-chip (SoC) (e.g., an SoC may include one or more processing devices 4002 and one or more storage devices 4004). Additionally, in various embodiments, the computing device 4000 may not include one or more of the components illustrated in FIG. 4, but may include interface circuitry (not shown) for coupling to the one or more components using any suitable interface (e.g., a Universal Serial Bus (USB) interface, a High-Definition Multimedia Interface (HDMI) interface, a Controller Area Network (CAN) interface, a Serial Peripheral Interface (SPI) interface, an Ethernet interface, a wireless interface, or any other appropriate interface). For example, the computing device 4000 may not include a display device 4010, but may include display device interface circuitry (e.g., a connector and driver circuitry) to which a display device 4010 may be coupled.

The computing device 4000 may include a processing device 4002 (e.g., one or more processing devices). As used herein, the term "processing device" may refer to any device or portion of a device that processes electronic data from registers and/or memory to transform that electronic data into other electronic data that may be stored in registers and/or memory. The processing device 4002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 4000 may include a storage device 4004 (e.g., one or more storage devices). The storage device 4004 may include one or more memory devices such as random access memory (RAM) (e.g., static RAM (SRAM) devices, magnetic RAM (MRAM) devices, dynamic RAM (DRAM) devices, resistive RAM (RRAM) devices, or conductive-bridging RAM (CBRAM) devices), hard drive-based memory devices, solid-state memory devices, networked drives, cloud drives, or any combination of memory devices. In some embodiments, the storage device 4004 may include memory that shares a die with a processing device 4002. In such an embodiment, the memory may be used as cache memory and may include embedded dynamic random access memory (eDRAM) or spin transfer torque magnetic random access memory (STT-MRAM), for example. In some embodiments, the storage device 4004 may include non-transitory computer readable media having instructions thereon that, when executed by one or more processing devices (e.g., the processing device 4002), cause the computing device 4000 to perform any appropriate ones of or portions of the methods disclosed herein.

The computing device 4000 may include an interface device 4006 (e.g., one or more interface devices 4006). The interface device 4006 may include one or more communication chips, connectors, and/or other hardware and software to govern communications between the computing device 4000 and other computing devices. For example, the interface device 4006 may include circuitry for managing wireless communications for the transfer of data to and from the computing device 4000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. Circuitry included in the interface device 4006 for managing wireless communications may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). In some embodiments, circuitry included in the interface device 4006 for managing wireless communications may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. In some embodiments, circuitry included in the interface device 4006 for managing wireless communications may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). In some embodiments, circuitry included in the interface device 4006 for managing wireless communications may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. In some embodiments, the interface device 4006 may include one or more antennas (e.g., one or more antenna arrays) to receipt and/or transmission of wireless communications.

In some embodiments, the interface device 4006 may include circuitry for managing wired communications, such as electrical, optical, or any other suitable communication protocols. For example, the interface device 4006 may include circuitry to support communications in accordance with Ethernet technologies. In some embodiments, the interface device 4006 may support both wireless and wired communication, and/or may support multiple wired communication protocols and/or multiple wireless communication protocols. For example, a first set of circuitry of the interface device 4006 may be dedicated to shorter-range wireless communications such as Wi-Fi or Bluetooth, and a second set of circuitry of the interface device 4006 may be dedicated to longer-range wireless communications such as global positioning system (GPS), EDGE, GPRS, CDMA, WiMAX, LTE, EV-DO, or others. In some embodiments, a first set of circuitry of the interface device 4006 may be dedicated to wireless communications, and a second set of circuitry of the interface device 4006 may be dedicated to wired communications.

The computing device 4000 may include battery/power circuitry 4008. The battery/power circuitry 4008 may include one or more energy storage devices (e.g., batteries or capacitors) and/or circuitry for coupling components of the computing device 4000 to an energy source separate from the computing device 4000 (e.g., AC line power).

The computing device 4000 may include a display device 4010 (e.g., multiple display devices). The display device 4010 may include any visual indicators, such as a heads-up display, a computer monitor, a projector, a touchscreen display, a liquid crystal display (LCD), a light-emitting diode display, or a flat panel display.

The computing device 4000 may include other input/output (I/O) devices 4012. The other I/O devices 4012 may include one or more audio output devices (e.g., speakers, headsets, earbuds, alarms, etc.), one or more audio input devices (e.g., microphones or microphone arrays), location devices (e.g., GPS devices in communication with a satellite-based system to receive a location of the computing device 4000, as known in the art), audio codecs, video codecs, printers, sensors (e.g., thermocouples or other temperature sensors, humidity sensors, pressure sensors, vibration sensors, accelerometers, gyroscopes, etc.), image capture devices such as cameras, keyboards, cursor control devices such as a mouse, a stylus, a trackball, or a touchpad, bar code readers, Quick Response (QR) code readers, or radio frequency identification (RFID) readers, for example.

The computing device 4000 may have any suitable form factor for its application and setting, such as a handheld or mobile computing device (e.g., a cell phone, a smart phone, a mobile internet device, a tablet computer, a laptop computer, a netbook computer, an ultrabook computer, a personal digital assistant (PDA), an ultra mobile personal computer, etc.), a desktop computing device, or a server computing device or other networked computing component.

One or more computing devices implementing any of the scientific instrument (e.g., CPM) support modules or methods disclosed herein may be part of a scientific instrument (e.g., CPM) support system. FIG. 5 is a block diagram of an example scientific instrument support system 5000 in which some or all of the scientific instrument support methods disclosed herein may be performed, in accordance with various embodiments. The scientific instrument support modules and methods disclosed herein (e.g., the scientific instrument support module 1000 of FIG. A and the methods 2000, 2005, and 2015 of FIGS. 2A-C) may be implemented by one or more of the scientific instrument 5010 (e.g., CPM, microscope, or other device), the user local computing device 5020, the service local computing device 5030, or the remote computing device 5040 of the scientific instrument support system 5000.

Any of the scientific instrument 5010, the user local computing device 5020, the service local computing device 5030, or the remote computing device 5040 may include any of the embodiments of the computing device 4000 discussed herein with reference to FIG. 4, and any of the scientific instrument 5010, the user local computing device 5020, the service local computing device 5030, or the remote computing device 5040 may take the form of any appropriate ones of the embodiments of the computing device 4000 discussed herein with reference to FIG. 4.

The scientific instrument 5010, the user local computing device 5020, the service local computing device 5030, or the remote computing device 5040 may each include a processing device 5002, a storage device 5004, and an interface device 5006. The processing device 5002 may take any suitable form, including the form of any of the processing devices 4002 discussed herein with reference to FIG. 4, and the processing devices 5002 included in different ones of the scientific instrument 5010, the user local computing device 5020, the service local computing device 5030, or the remote computing device 5040 may take the same form or different forms. The storage device 5004 may take any suitable form, including the form of any of the storage devices 5004 discussed herein with reference to FIG. 4, and the storage devices 5004 included in different ones of the scientific instrument 5010, the user local computing device 5020, the service local computing device 5030, or the remote computing device 5040 may take the same form or different forms. The interface device 5006 may take any suitable form, including the form of any of the interface devices 4006 discussed herein with reference to FIG. 4, and the interface devices 5006 included in different ones of the scientific instrument 5010, the user local computing device 5020, the service local computing device 5030, or the remote computing device 5040 may take the same form or different forms.

The scientific instrument 5010, the user local computing device 5020, the service local computing device 5030, and the remote computing device 5040 may be in communication with other elements of the scientific instrument support system 5000 via communication pathways 5008. The communication pathways 5008 may communicatively couple the interface devices 5006 of different ones of the elements of the CPM support system 5000, as shown, and may be wired or wireless communication pathways (e.g., in accordance with any of the communication techniques discussed herein with reference to the interface devices 4006 of the computing device 4000 of FIG. 4). The particular scientific instrument support system 5000 depicted in FIG. 5 includes communication pathways between each pair of the scientific instrument 5010, the user local computing device 5020, the service local computing device 5030, and the remote computing device 5040, but this "fully connected" implementation is simply illustrative, and in various embodiments, various ones of the communication pathways 5008 may be absent. For example, in some embodiments, a service local computing device 5030 may not have a direct communication pathway 5008 between its interface device 5006 and the interface device 5006 of the scientific instrument 5010, but may instead communicate with the scientific instrument 5010 via the communication pathway 5008 between the service local computing device 5030 and the user local computing device 5020 and the communication pathway 5008 between the user local computing device 5020 and the scientific instrument 5010.

The user local computing device 5020 may be a computing device (e.g., in accordance with any of the embodiments of the computing device 4000 discussed herein) that is local to a user of the scientific instrument 5010. In some embodiments, the user local computing device 5020 may also be local to the scientific instrument 5010, but this need not be the case; for example, a user local computing device 5020 that is in a user's home or office may be remote from, but in communication with, the scientific instrument 5010 so that the user may use the user local computing device 5020 to control and/or access data from the scientific instrument 5010. In some embodiments, the user local computing device 5020 may be a laptop, smartphone, or tablet device. In some embodiments the user local computing device 5020 may be a portable computing device.

The service local computing device 5030 may be a computing device (e.g., in accordance with any of the embodiments of the computing device 4000 discussed herein) that is local to an entity that services the scientific instrument 5010. For example, the service local computing device 5030 may be local to a manufacturer of the scientific instrument 5010 or to a third-party service company. In some embodiments, the service local computing device 5030 may communicate with the scientific instrument 5010, the user local computing device 5020, and/or the remote computing device 5040 (e.g., via a direct communication pathway 5008 or via multiple "indirect" communication pathways 5008, as discussed above) to receive data regarding the operation of the scientific instrument 5010, the user local computing device 5020, and/or the remote computing device 5040 (e.g., the results of self-tests of the scientific instrument 5010, calibration coefficients used by the scientific instrument 5010, the measurements of sensors associated with the scientific instrument 5010, etc.). In some embodiments, the service local computing device 5030 may communicate with the scientific instrument 5010, the user local computing device 5020, and/or the remote computing device 5040 (e.g., via a direct communication pathway 5008 or via multiple "indirect" communication pathways 5008, as discussed above) to transmit data to the scientific instrument 5010, the user local computing device 5020, and/or the remote computing device 5040 (e.g., to update programmed instructions, such as firmware, in the scientific instrument 5010, to initiate the performance of test or calibration sequences in the scientific instrument 5010, to update programmed instructions, such as software, in the user local computing device 5020 or the remote computing device 5040, etc.). A user of the scientific instrument 5010 may utilize the scientific instrument 5010 or the user local computing device 5020 to communicate with the service local computing device 5030 to report a problem with the scientific instrument 5010 or the user local computing device 5020, to request a visit from a technician to improve the operation of the scientific instrument 5010, to order consumables or replacement parts associated with the scientific instrument 5010, or for other purposes.

The remote computing device 5040 may be a computing device (e.g., in accordance with any of the embodiments of the computing device 4000 discussed herein) that is remote from the scientific instrument 5010 and/or from the user local computing device 5020. In some embodiments, the remote computing device 5040 may be included in a datacenter or other large-scale server environment. In some embodiments, the remote computing device 5040 may include network-attached storage (e.g., as part of the storage device 5004). The remote computing device 5040 may store data generated by the scientific instrument 5010, perform analyses of the data generated by the scientific instrument 5010 (e.g., in accordance with programmed instructions), facilitate communication between the user local computing device 5020 and the scientific instrument 5010, and/or facilitate communication between the service local computing device 5030 and the scientific instrument 5010.

In some embodiments, one or more of the elements of the scientific instrument support system 5000 illustrated in FIG. 5 may not be present. Further, in some embodiments, multiple ones of various ones of the elements of the scientific instrument support system 5000 of FIG. 5 may be present. For example, a scientific instrument support system 5000 may include multiple user local computing devices 5020 (e.g., different user local computing devices 5020 associated with different users or in different locations). In another example, a scientific instrument support system 5000 may include multiple scientific instrument 5010, all in communication with service local computing device 5030 and/or a remote computing device 5040; in such an embodiment, the service local computing device 5030 may monitor these multiple scientific instrument 5010, and the service local computing device 5030 may cause updates or other information may be "broadcast" to multiple scientific instruments 5010 at the same time. Different ones of the scientific instruments 5010 in a scientific instrument support system 5000 may be located close to one another (e.g., in the same room) or farther from one another (e.g., on different floors of a building, in different buildings, in different cities, etc.). In some embodiments, a scientific instrument 5010 may be connected to an Internet-of-Things (IoT) stack that allows for command and scientific instrument of the scientific instrument 5010 through a web-based application, a virtual or augmented reality application, a mobile application, and/or a desktop application. Any of these applications may be accessed by a user operating the user local computing device 5020 in communication with the scientific instrument 5010 by the intervening remote computing device 5040. In some embodiments, a scientific instrument 5010 may be sold by the manufacturer along with one or more associated user local computing devices 5020 as part of a scientific instrument computing unit 5012.

The following provide non-limiting examples of identifiers that may be used for a scientific instrument, such as a charged particle microscopy. It should be understood that other identifiers may be used and these are only provided for purposes of illustration.

Figure 6:
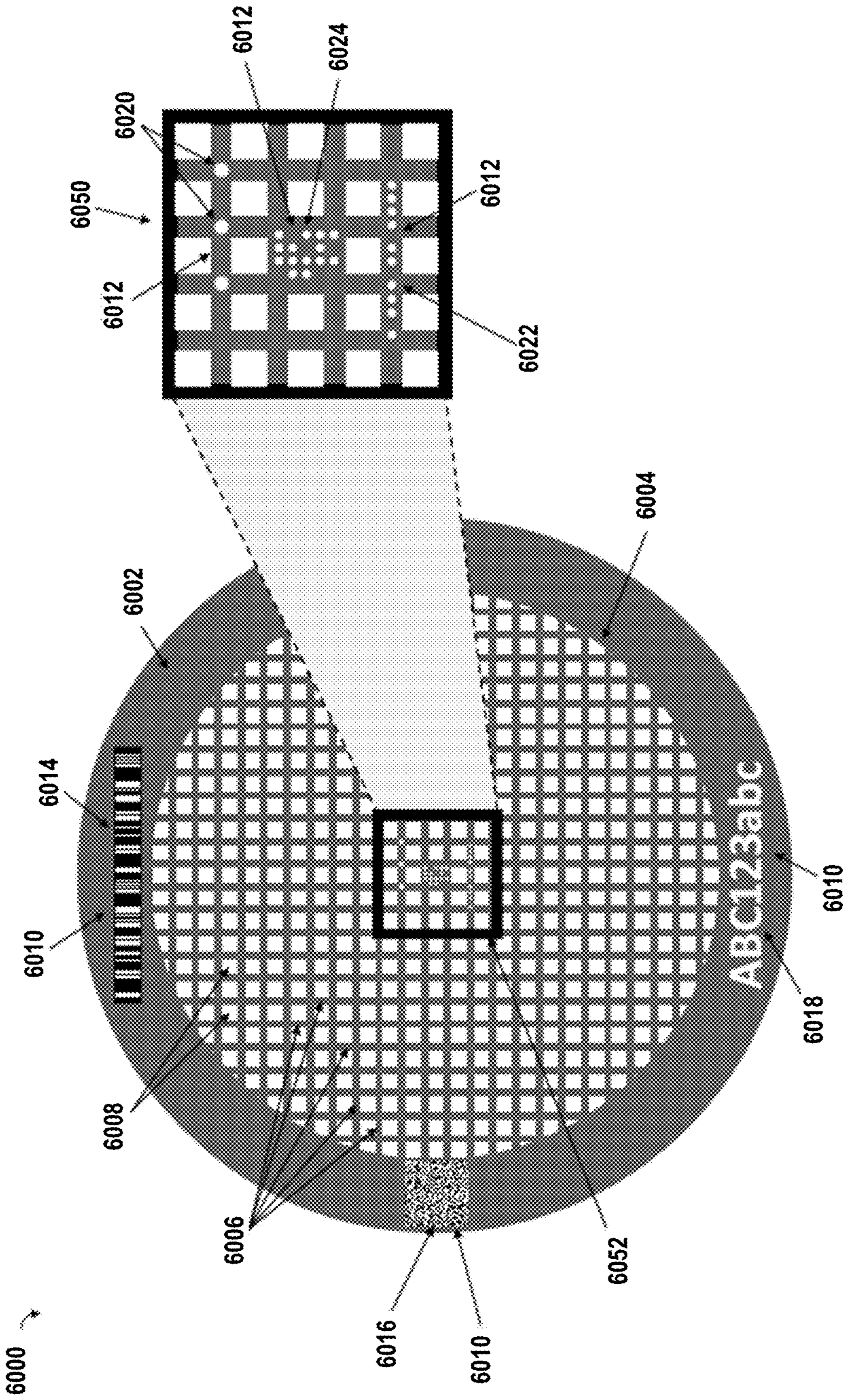
FIG. 6 shows an example sample container and related identifiers in accordance with various embodiments.

FIG. 6 is an illustration of a sample grid 6000 having multi-modal charged particle microscope (e.g., cryo-EM) compatible identifiers (e.g., globally unique identifiers). FIG. 6 illustrates a sample grid 6000 as comprising an outer support structure 6002 that defines a region of the grid 6004 for holding one or more samples. The sample grid 6000 is shown as having a circular shape, however it may have other shapes avoiding to the present invention. Specifically, the sample grid 6000 may have any shape that allows it to be loaded into and/or operate within a vitrification device, an electron microscope, a sample grid holding device, or other device(s) in the sample evaluation workflow. For example, the sample grid 6000 may be shaped so as to be compatible with one or more devices and/or setups for loading one or more samples on the sample grid 100, going through a vitrification process in which the one or more samples are vitrified, and/or facilitating the examination of the vitrified samples with an electron microscope.

The region of the grid 6004 for holding one or samples may comprise a one or more inner support structures 106 that define a plurality of apertures 6008. The inner support structure(s) 6006 may be rigid support structures that are configured to support and/or hold samples within the one or more apertures 6008. For example, FIG. 6 shows the one or more inner support structures 6006 as being a plurality of bars (e.g., copper bars) that create a plurality of square apertures 6008 for holding samples. Example inner support structure(s) 6006 may be composed of many different materials capable of supporting and/or holding samples, such as but not limited to, copper, gold, molybdenum, silicon, silicon-nitride, another crystalline material, another metal, or a combination thereof. In some embodiments, the inner support structures may be component portions of the outer support 6002, may be separate structures fastened, glued, welded or otherwise attached to the outer support structure 6002, or a combination thereof. The samples may include biological samples that are suspended in a solution. In this way, the solution may be placed in an aperture 6008 within the sample grid 6000 having multi-modal charged particle microscope compatible identifiers. In some embodiments, the one or more inner support structures 6006 comprise a single inner support structure. For example, such an inner support structure may comprise a grid shaped structure that defines the plurality of apertures 6008. Alternatively, the inner support structure(s) 6006 may be a single structure with regions of varying thickness, and where the plurality of apertures 6008 correspond to regions of the single structure having a thickness that allows incident electrons to pass through, causing these regions to be transparent when viewed with a charged particle microscope (e.g., transmission electron microscope).

While not shown in FIG. 6, the apertures 6008 may include a structure configured to retain the sample/solution containing the solution within the aperture 108, such as a mesh, a foil, etc. For example, a layer of foil (e.g., carbon foil) may exist on top of one or more inner support structures 6006 and extend over one or more of the plurality of inner support structures 6006. In this way, when a sample is placed on top of the foil, the foil may allow the sample to be positioned above of the plurality of inner support structures 6006. In this way, because electrons are allowed to pass through the foil, the samples are visible with a charged particle microscope (e.g., transmission electron microscope).

As further shown in FIG. 6, the sample grid 6000 may have multi-modal charged particle microscope (e.g., cryo-EM) compatible identifiers. Specifically, the sample grid 6000 may have one or more first mode charged particle microscope (e.g., cryo-EM) identifiers 6010, and one or more second mode charged particle microscope (e.g., cryo-EM) compatible identifiers 6012. Each of the first mode charged particle microscope (e.g., cryo-EM) compatible identifiers 6010 and the second mode charged particle microscope (e.g., cryo-EM) compatible identifiers 6012 may be vitrification compatible. That means that they are (1) readable both before and after the sample grid 6000 is subjected to a vitrification process, and (2) do not introduce additional thermal mass to the sample grid that interferes with the vitrification process and/or interferes with the vitrification of the solution(s) held within the region of the grid 6004.

The first mode charged particle microscope (e.g., cryo-EM) compatible identifier 6010 may be located on the outer support structure 6002, and are configured to be read with an optical detector. The first mode charged particle microscope (e.g., cryo-EM) compatible identifiers 6010 may be printed on the outer support structure 6002, imprinted or scratched mechanically to deform the surface, additively marked, laser-etched, surface roughed by a laser or ion-beam, surface restructured with a laser or ion-beam, chemically colored, chemically etched to remove surface material, electrical discharge machined (EDM) to remove surface material, drilled, or applied with a photoresist process. For example, the first mode charged particle microscope (e.g., cryo-EM) compatible identifiers 6010 may include a barcode 6014, a QR code 6016, an alphanumeric code 6018, a data matrix, or another optically readable ID.

The second mode particle microscope (e.g., cryo-EM) compatible identifiers 6012 may be located within the region of the grid 6004 for holding samples, and are readable with an electron microscope. That is, the second mode charged particle microscope (e.g., cryo-EM) compatible identifiers 6012 may be configured to be read by an electron microscope after vitrification of the sample grid 100 and during/concurrent with the examination of the samples. FIG. 6 includes an expanded view 6050 of a sub-region 6052 of the region 6004 for holding samples. The second mode charged particle microscope (e.g., cryo-EM) compatible identifiers 6012 may comprise holes or cutouts through which electrons are allowed to pass through and/or travel to one or more detectors. That is, because the inner support structures 6006 must have sufficient mechanical strength to support the samples, the thickness of the inner support structures 6006 is such that they block electrons. Because of this, when evaluated and/or analyzed with a transmission electron microscope, the inner support structures 6006 appear as dark features (due to their preventing electrons from reaching microscope detectors) and the individual holes or cutouts of the second mode charged particle microscope (e.g., cryo-EM) compatible identifiers 6012 appear as light features within the inner support structures 6006 (as they allow electrons to pass through the inner support structures 6006).

While the holes depicted in FIG. 6 are substantially circular in shape, in different embodiments may have various other shapes such as star, square, etc. Alternatively, the holes may also include half-circle or squared cutouts on the edges of the inner support structures 6006. The pattern of the holes in the second mode charged particle microscope (e.g., cryo-EM) compatible identifiers 6012 are configured to allow for global identification of the sample grid 6000. For example, the sizes of the holes, positioning of the holes, shapes of the holes, spaces between the holes, may be varied and/or otherwise patterned so as to encode one or more identifiers associated with the sample grid 6000. In some embodiments, the second mode charged particle microscope (e.g., cryo-EM) compatible identifiers 6012 may further encode orientation information relating to the sample grid 100. For example, the second mode charged particle microscope (e.g., cryo-EM) compatible identifiers 6012 may encode information about the location of the second mode charged particle microscope (e.g., cryo-EM) compatible identifiers 6012 on the sample grid 6000 and/or the orientation of the second mode charged particle microscope (e.g., cryo-EM) compatible identifiers 6012 in relation to the sample grid 6000.

FIG. 6 shows the second mode charged particle microscope (e.g., cryo-EM) compatible identifiers 6012 as including a pattern of large cutouts 6020 placed at cross points of the inner support structures 106, as a plurality of small cutouts 122 placed along a single inner support structure 6006, and a non-linear array of holes 6024. A single sample grid 6000 may include multiple types of second mode charged particle microscope (e.g., cryo-EM) compatible identifiers 6012, and/or a single type of second mode charged particle microscope (e.g., cryo-EM) compatible identifiers 6012 may be repeated at multiple locations within the region of the grid 6004 for holding one or samples.

Figure 7:
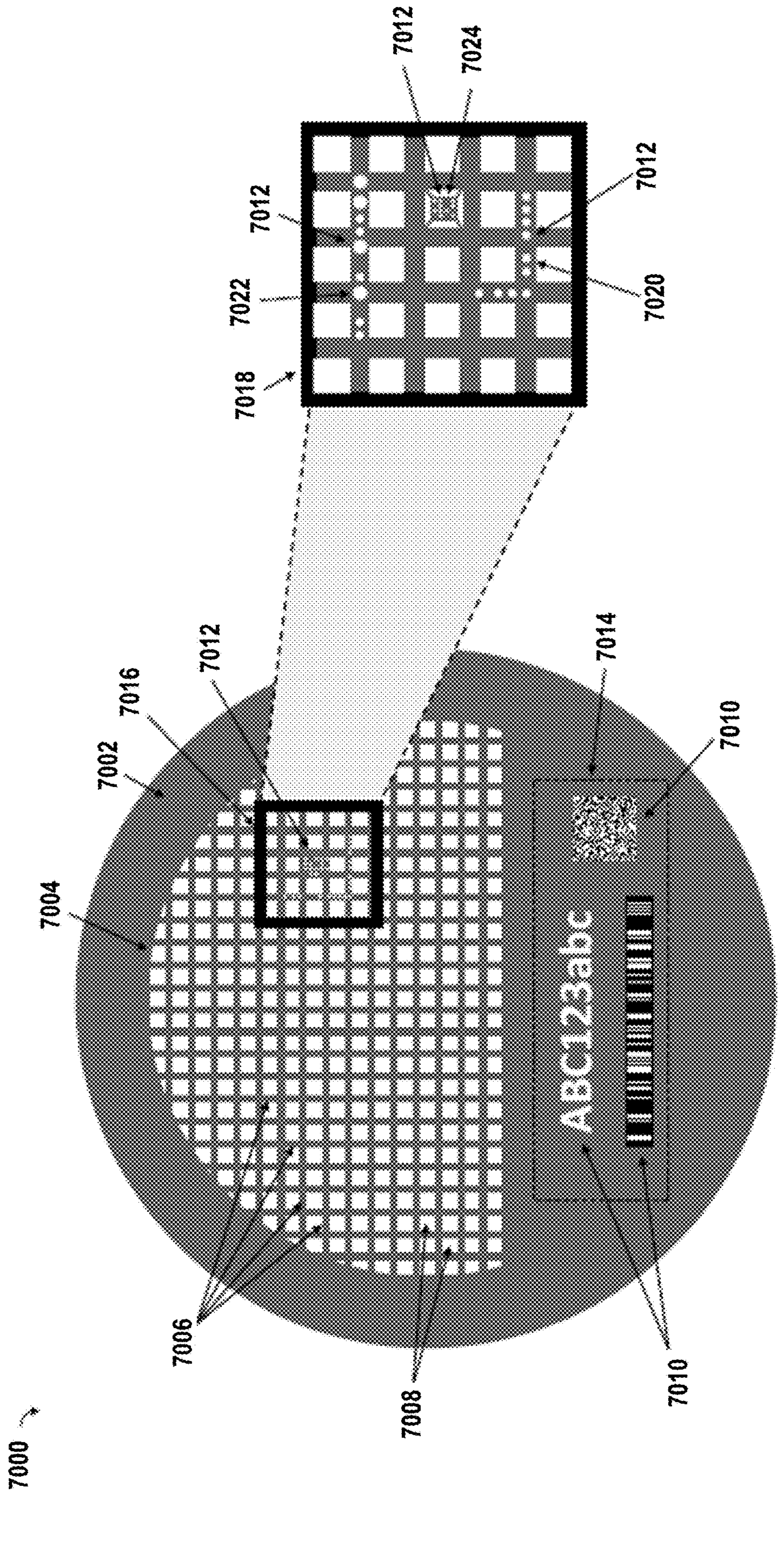
FIG. 7 shows another example sample container and related identifiers in accordance with various embodiments.

FIG. 7 is an illustration of an alternative sample grid 7000 having multi-modal charged particle microscope (e.g., cryo-EM) compatible identifiers. FIG. 7 illustrates sample grid 7000 may comprise outer support structure 7002 that defines a half-circle shaped region of the grid 7004 for holding one or more samples. The region of the grid 7004 for holding one or samples may comprise a plurality of inner support structures 7006 that define a plurality of apertures 7008.

As further shown in FIG. 7, the sample grid 7000 may have one or more first mode particle microscope (e.g., cryo-EM) compatible identifiers 7010, and one or more second mode charged particle microscope (e.g., cryo-EM) compatible identifiers 7012. Each of the first mode particle microscope (e.g., cryo-EM) compatible identifiers 7010 and the second mode charged particle microscope (e.g., cryo-EM) compatible identifiers 7012 are vitrification compatible. FIG. 7 illustrates the first mode charged particle microscope (e.g., cryo-EM) compatible identifiers 7010 as being co-located within an identification region 7014. While each type of first mode charged particle microscope (e.g., cryo-EM) compatible identifiers is shown as occurring only one time in sample grid 7000, in other embodiments the identifiers may be repeated at multiple locations on the sample grid 7000. Additionally, FIG. 7 illustrates the second mode charged particle microscope (e.g., cryo-EM) compatible identifiers 7012 as being located in a non-central location 7016. As shown in the magnified inset 7018 of the non-central location 7016, the second mode charged particle microscope (e.g., cryo-EM) compatible identifiers 7012 include a non-linear pattern of small holes 7020 along two adjoining inner support structures, and a series of holes of varying size 7022. FIG. 7 further illustrates an inset structure 7024 that is located within an aperture, and which includes a non-linear pattern of holes. The inset structure 7024 is thermally isolated from the inner support structures.

The following paragraphs provide various examples of the embodiments disclosed herein.

Example 1 is a method comprising: determining, by a first device, an identifier associated with a sample; sending, to a second device, a request comprising the identifier, wherein the second device is configured to determine application data based on the identifier; receiving, based on the request, the application data; and causing, based on the application data, a charged particle microscope to process the sample.

Example 2 includes the subject matter of Example 1, and further specifies that the first device comprises a computing device of a service for processing a plurality of samples.

Example 3 includes the subject matter of Example 2, and further specifies that the first device is one of a plurality of computing devices geographical distributed at a plurality of premises for implementing the service for processing the plurality of samples.

Example 4 includes the subject matter of any one of Examples 1-3, and further specifies that the first device comprises one or more of a computing device configured to operate the charged particle microscope or a computing device integrated into the charged particle microscope.

Example 5 includes the subject matter of any one of Examples 1-4, and further specifies that the identifier comprises one or more of a scannable code, a bar code, or a quick response code.

Example 6 includes the subject matter of any one of Examples 1-5, and further specifies that the identifier is one or more of affixed to or integrated into a container of the sample.

Example 7 includes the subject matter of Example 6, and further specifies that the container comprises a microscopy grid container.

Example 8 includes the subject matter of any one of Examples 1-7, and further specifies that determining the identifier is based on user input.

Example 9 includes the subject matter of Example 8, and further specifies that the user input comprises one or more of a user scanning the identifier, the user inputting the identifier in a user interface, or the user selecting the identifier.

Example 10 includes the subject matter of any one of Examples 1-9, and further specifies that determining the identifier comprises determining the identifier based on an association of the identifier with an order for a container comprising the sample.

Example 11 includes the subject matter of any one of Examples 1-10, and further specifies that determining the identifier comprises generating an image of at least a portion of the sample with the charged particle microscope and analyzing the image to determine the identifier.

Example 12 includes the subject matter of any one of Examples 1-11, and further specifies that the application data is determined based on an association of the application data and the identifier.

Example 13 includes the subject matter of Example 12, and further specifies that the association is based on user input via a user interface associating the application data and the identifier.

Example 14 includes the subject matter of any one of Examples 12-13, and further specifies that the association is based on an association of the identifier with an order for one or more of processing a plurality of samples or purchasing a plurality of sample containers.

Example 15 includes the subject matter of any one of Examples 1-14, and further specifies that the application data comprises an application container comprising one or more applications.

Example 16 includes the subject matter of Example 15, and further specifies that the application container comprises a container image comprising one or more computer-readable code packages.

Example 17 includes the subject matter of any one of examples 15-16, and further specifies that the application container comprises a container image comprising an application for performing an operation and one or more application packages relied upon by the application.

Example 18 includes the subject matter of any one of Examples 15-17, and further specifies that the application container comprises a container image configured to virtualize an operating system.

Example 19 includes the subject matter of any one of Examples 1-18, and further specifies that the application data comprises one or more of a file, a container, or a script comprising an application.

Example 20 includes the subject matter of any one of Examples 1-19, and further specifies that causing the charged particle microscope to process the sample comprises one or more of processing the application data, unpackaging the application data, or using the application data to generate an application container.

Example 21 includes the subject matter of any one of Examples 1-20, and further specifies that causing the charged particle microscope to process the sample comprises processing instructions in the application data to launch an application environment and execute an application in the application environment.

Example 22 includes the subject matter of any one of Examples 1-21, and further specifies that causing the charged particle microscope to process the sample comprises executing an application comprised in the application data to cause one or more operations.

Example 23 includes the subject matter of any one of Examples 1-22, and further specifies that causing the charged particle microscope to process the sample comprises causing the charged particle microscope to perform one or more commands indicated in the application data to process the sample.

Example 24 includes the subject matter of any one of Examples 1-23, and further specifies that causing the charged particle microscope to process the sample comprises causing the charged particle microscope to set one or more operational settings for processing the sample.

Example 25 includes the subject matter of any one of Examples 1-24, and further specifies that causing the charged particle microscope to process the sample comprises processing imaging data of the sample generated by the charged particle microscope.

Example 26 includes the subject matter of Example 25, and further specifies that processing the imaging data comprises inputting the imaging data to a machine-learning model.

Example 27 includes the subject matter of any one of Examples 25-26, and further specifies that processing the imaging data comprises analyzing the imaging data and determining a command for the charged particle microscope based on the analysis.

Example 28 includes the subject matter of any one of Examples 25-27, and further specifies that processing the imaging data comprises sending the imaging data to a storage location external to a premises at which the charged particle microscope is located.

Example 29 includes the subject matter of any one of Examples 25-28, and further specifies that processing the imaging data comprises causing a transaction indicative of the processing of the sample to be added to a distributed ledger.

Example 30 includes the subject matter of Example 29, and further specifies that the transaction comprises one or more of a time at which processing the sample to generate imaging data occurred, a location of the charged particle microscope, an indication of the identifier, or validation information.

Example 31 includes the subject matter of any one of Examples 1-30, and further specifies that the application data comprises a privacy condition and causing the charged particle microscope to process the sample comprises processing imaging data of the sample according to the privacy condition.

Example 32 includes the subject matter of Example 31, and further specifies that the privacy condition comprises a condition to one or more of prevent access to the imaging data, encrypt the imaging data, or use credentials to cause storage of the imaging data.

Example 33 is a method comprising: receiving, by a first device located at a premises and from a second device located external to the premises, and via a network, configuration data for a charged particle microscope located at the premises; updating, by the first device and based on the configuration data, one or more configuration settings associated with the charged particle microscope; and causing, based on the updated one or more configuration settings, one or more operations associated with the charged particle microscope to be performed.

Example 34 includes the subject matter of Example 33, and further specifies that the first device comprises a computing device of a service for processing a plurality of samples.

Example 35 includes the subject matter of Example 34, and further specifies that the first device is one of a plurality of computing devices geographical distributed at a plurality of premises for implementing the service for processing the plurality of samples.

Example 36 includes the subject matter of any one of Examples 33-35, and further specifies that the second device comprises a server associated with a service for processing a plurality of samples.

Example 37 includes the subject matter of any one of Examples 33-36, and further specifies that receiving the configuration data is based on a detection of a triggering condition.

Example 38 includes the subject matter of Example 37, and further specifies that the triggering condition comprises one or more of a scheduled update or a request for the configuration data.

Example 39 includes the subject matter of any one of Examples 37-38, and further specifies that the triggering condition comprises one or more of: determining an identifier of a sample for imaging by the charged particle microscope, or determining at least one of at sample type, sample characteristic, or sample pattern.

Example 40 includes the subject matter of Example 39, and further specifies that the identifier comprises one or more of a scannable code, a bar code, or a quick response code.

Example 41 includes the subject matter of any one of Examples 39-40, and further specifies that the identifier is one or more of affixed to or integrated into a container of the sample.

Example 42 includes the subject matter of Example 41, and further specifies that the container comprises a microscopy grid container.

Example 43 includes the subject matter of any one of Examples 39-42, and further specifies that determining the identifier is based on user input.

Example 44 includes the subject matter of Example 43, and further specifies that the user input comprises one or more of a user scanning the identifier, a user inputting the identifier in a user interface, the user selecting the identifier, or the user pressing a button to cause automated generation of the identifier.

Example 45 includes the subject matter of any one of Examples 39-44, and further specifies that determining the identifier comprises receiving the identifier based on an association of the identifier with an order associated with a container comprising the sample.

Example 46 includes the subject matter of any one of Examples 33-45, and further specifies that the configuration data comprises one or more of a parameter setting for operating the charged particle microscope or a command for the charged particle microscope.

Example 47 includes the subject matter of any one of Examples 33-46, and further specifies that the configuration data comprises an application container comprising one or more applications.

Example 48 includes the subject matter of Example 47, and further specifies that the application container comprises a container image comprising one or more computer-readable code packages.

Example 49 includes the subject matter of any one of Examples 47-48, and further specifies that the application container comprises a container image comprising an application for performing an operation and one or more application packages relied upon by the application.

Example 50 includes the subject matter of any one of Examples 47-49, and further specifies that the application container comprises a container image configured to virtualize an operating system.

Example 51 includes the subject matter of any one of Examples 33-50, and further specifies that the configuration data comprises one or more of a file, a container, or a script comprising computer-readable instructions associated with operation of the charged particle microscope.

Example 52 includes the subject matter of any one of Examples 33-51, and further specifies that receiving the configuration data is based on user input.

Example 53 includes the subject matter of Example 52, and further specifies that the user input comprises one or more of a user inputting at least one command in a script language, the user selecting prior uploaded configuration data, or a user uploading a file comprising the configuration data.

Example 54 includes the subject matter of any one of Examples 52-53, and further specifies that the user input comprises a user selecting, via a user interface, a sequence of one or more commands and corresponding parameters, wherein the configuration data is generated based on the sequence.

Example 55 includes the subject matter of any one of Examples 33-54, and further specifies that updating the one or more configuration settings comprises one or more of processing the configuration data, unpackaging the configuration data, or using the configuration data to generate an application container.

Example 56 includes the subject matter of any one of Examples 33-55, and further specifies that updating the one or more configuration settings comprises processing instructions in the configuration data to one or more of launch an application environment or execute an application in the application environment.

Example 57 includes the subject matter of any one of Examples 33-56, and further specifies that updating the one or more configuration settings comprises translating one or more of a command or a parameter in the configuration data to a corresponding command or parameter of an interface associated with the charged particle microscope.

Example 58 includes the subject matter of any one of Examples 33-57, and further specifies that updating the one or more configuration settings comprises updating a configuration setting of the first device associated with controlling the charged particle microscope.

Example 59 includes the subject matter of any one of Examples 33-58, and further specifies that updating the one or more configuration settings comprises sending, by the first device, the configuration data to the charged particle microscope.

Example 60 includes the subject matter of any one of Examples 33-59, and further specifies that the one or more operations comprises generating imaging data based on a sample.

Example 61 includes the subject matter of any one of Examples 33-60, and further specifies that the one or more operations comprises executing an application comprised in the configuration data to cause a sequence of operations.

Example 62 includes the subject matter of any one of Examples 33-61, and further specifies that the one or more operations comprises one or more commands indicated in the configuration data associated with processing a sample.

Example 63 includes the subject matter of any one of Examples 33-62, and further specifies that the one or more operations comprises processing imaging data of a sample generated by the charged particle microscope.

Example 64 includes the subject matter of Example 63, and further specifies that processing the imaging data comprises inputting the imaging data to a machine-learning model.

Example 65 includes the subject matter of any one of Examples 63-64, and further specifies that processing the imaging data comprises analyzing the imaging data and determining a command for the charged particle microscope based on the analysis.

Example 66 includes the subject matter of any one of Examples 63-65, and further specifies that processing the imaging data comprises sending the imaging data to a storage location external to the premises at which the charged particle microscope is located.

Example 67 includes the subject matter of any one of Examples 63-66, and further specifies that processing the imaging data comprises causing a transaction indicative of the processing of the sample to be added to a distributed ledger.

Example 68 includes the subject matter of Example 67, and further specifies that the transaction comprises one or more of a time at which processing the sample to generate imaging data occurred, a location of the charged particle microscope, an indication of an identifier associated with an imaged sample, or validation information.

Example 69 includes the subject matter of any one of Examples 33-68, and further specifies that the configuration data comprises a privacy condition and the one or more operations comprises processing imaging data of a sample according to the privacy condition.

Example 70 includes the subject matter of Example 69, and further specifies that the privacy condition comprises a condition to one or more of prevent access to the imaging data, encrypt the imaging data, or use credentials to cause storage of the imaging data.

Example 71 is a method comprising: receiving, by a first device, an identifier associated with a sample; receiving application data for processing the sample; determining an association of the application data and the identifier; and sending, to a second device, the application data, the identifier, and data indicative of the association, wherein the second device is configured to provide, based on the identifier, access to the application data to configure a charged particle microscope to analyze the sample.

Example 72 includes the subject matter of Example 71, and further specifies that the identifier comprises one or more of a scannable code, a bar code, or a quick response code.

Example 73 includes the subject matter of any one of Examples 71-72, and further specifies that the identifier is one or more of affixed to or integrated into a container of the sample.

Example 74 includes the subject matter of Example 73, and further specifies that the container comprises a microscopy grid container.

Example 75 includes the subject matter of any one of Examples 71-74, and further specifies that receiving the identifier is based on user input.

Example 76 includes the subject matter of Example 75, and further specifies that the user input comprises one or more of a user scanning the identifier, the user inputting the identifier in a user interface, the user selecting the identifier, or the user pressing a button to cause automated generation of the identifier.

Example 77 includes the subject matter of any one of Examples 71-76, and further specifies that receiving the identifier comprises receiving the identifier based on an association of the identifier with an order for a container comprising the sample.

Example 78 includes the subject matter of any one of Examples 71-77, and further specifies that receiving the application data is based on user input.

Example 79 includes the subject matter of Example 78, and further specifies that the user input comprises one or more of a user inputting at least one command in a script language, the user selecting a prior uploaded application data package, or a user uploading a file comprising the application data.

Example 80 includes the subject matter of any one of Examples 78-79, and further specifies that the user input comprises a user selecting, via a user interface, a sequence of one or more commands and corresponding parameters, wherein the application data is generated based on the sequence.

Example 81 includes the subject matter of any one of Examples 71-80, and further specifies that the application data comprises an application container comprising one or more applications.

Example 82 includes the subject matter of Example 81, and further specifies that the application container comprises a container image comprising one or more computer-readable code packages.

Example 83 includes the subject matter of any one of Examples 81-82, and further specifies that the application container comprises a container image comprising an application for performing an operation and one or more application packages relied upon by the application.

Example 84 includes the subject matter of any one of Examples 81-83, and further specifies that the application container comprises a container image configured to virtualize an operating system.

Example 85 includes the subject matter of any one of Examples 71-84, and further specifies that the application data comprises one or more of a file, a container, or a script comprising an application.

Example 86 includes the subject matter of any one of Examples 71-85, and further specifies that the application data comprises a privacy condition associated with processing the sample.

Example 87 includes the subject matter of Example 86, and further specifies that the privacy condition comprises a condition to one or more of prevent access to imaging data of the sample, encrypt the imaging data, or use credentials to cause storage of the imaging data.

Example 88 includes the subject matter of any one of Examples 71-87, and further specifies that the application data comprises computer-readable instructions for causing a transaction indicative of the processing of the sample to be added to a distributed ledger.

Example 89 includes the subject matter of Example 88, and further specifies that the transaction comprises one or more of a time at which processing the sample to generate imaging data occurred, a location of the charged particle microscope, an indication of an identifier associated with an imaged sample, or validation information.

Example 90 includes the subject matter of any one of Examples 71-89, and further specifies that determining the association comprises receiving user input via a user interface associating the application data and the identifier.

Example 91 includes the subject matter of any one of Examples 71-90, and further specifies that determining the association comprises determining the association based on an association of the identifier with an order for one or more of processing a plurality of samples or purchasing a plurality of sample containers.

Example 92 includes the subject matter of any one of Examples 71-91, and further specifies that the second device comprises a computing device of a service for processing a plurality of samples.

Example 93 includes the subject matter of any one of Examples 71-92, and further specifies that the second device is configured to provide access to the application data to a third device.

Example 94 includes the subject matter of Example 93, and further specifies that the third device is one of a plurality of computing devices geographical distributed at a plurality of premises for implementing the service for processing the plurality of samples.

Example 95 includes the subject matter of any one of Examples 93-94, and further specifies that the third device comprises one or more of a computing device configured to operate the charged particle microscope or a computing device integrated into the charged particle microscope.

Example 96 includes the subject matter of any one of Examples 71-95, and further specifies that sending the application data, the identifier, and data indicative of the association comprises causing storage of the application data, the identifier, and data indicative of the association.

Example 97 is a device comprising: one or more processors; and a memory storing instructions that, when executed by the one or more processors, cause the device to perform the methods of any one of Examples 1-96.

Example 98 is a non-transitory computer-readable medium storing instructions that, when executed by one or more processors, cause a device to perform the methods of any one of Examples 1-96.

Example 99 is a system comprising: a scientific instrument device configured to perform one or more operations; and a computing device comprising one or more processors, and a memory, wherein the memory stores instructions that, when executed by the one or more processors, cause the computing device to perform the methods of any one of Examples 1-96.

Example 100 is a scientific instrument support apparatus, comprising logic to perform the methods of any one of Examples 1-96.

Example 101 includes any of the scientific instrument support modules disclosed herein.

Example 102 includes any of the methods disclosed herein.

Example 103 includes any of the GUIs disclosed herein.

Example 104 includes any of the scientific instrument support computing devices and systems disclosed herein.

The invention claimed is:

1. A method comprising:
- determining, by a first device, an identifier associated with a sample;
- sending, to a second device, a request comprising the identifier, wherein the second device is configured to determine application data based on the identifier, wherein the application data comprises an application container comprising one or more applications;
- receiving, based on the request, the application data; and
- causing, based on the application data, a charged particle microscope to process the sample.

2. The method of claim 1, wherein the first device comprises one or more of a computing device configured to operate the charged particle microscope or a computing device integrated into the charged particle microscope.

3. The method of claim 1, wherein the identifier comprises one or more of a scannable code, a bar code, or a quick response code, and wherein the identifier is one or more of affixed to or integrated into a container of the sample.

4. The method of claim 1, wherein determining the identifier comprises one or more of: determine the identifier based on user input or generating an image of at least a portion of the sample with the charged particle microscope and analyzing the image to determine the identifier.

5. The method of claim 1, wherein causing the charged particle microscope to process the sample comprises one or more of processing the application data, unpackaging the application data, or using the application data to generate an application container.

6. The method of claim 1, wherein causing the charged particle microscope to process the sample comprises one or more of: executing an application comprised in the application data to cause one or more operations, causing the charged particle microscope to perform one or more commands indicated in the application data to process the sample, causing the charged particle microscope to set one or more operational settings for processing the sample, or processing imaging data of the sample generated by the charged particle microscope.

7. A first device comprising:
- one or more processors;
- memory; and
- a set of computer-executable instructions stored in the memory that, when executed by the one or more processors, cause:
  - determining an identifier associated with a sample;
  - sending, to a second device, a request comprising the identifier, wherein the second device is configured to determine application data based on the identifier, wherein the application data comprises an application container comprising one or more applications;
  - receiving, based on the request, the application data; and
  - causing, based on the application data, a charged particle microscope to process the sample.

8. The first device of claim 7, wherein the first device comprises one or more of a computing device configured to operate the charged particle microscope or a computing device integrated into the charged particle microscope.

9. The first device of claim 7, wherein the identifier comprises one or more of a scannable code, a bar code, or a quick response code, and wherein the identifier is one or more of affixed to or integrated into a container of the sample.

10. The first device of claim 7, wherein determining the identifier comprises one or more of: determine the identifier based on user input or generating an image of at least a portion of the sample with the charged particle microscope and analyzing the image to determine the identifier.

11. The first device of claim 7, wherein causing the charged particle microscope to process the sample comprises one or more of processing the application data, unpackaging the application data, or using the application data to generate an application container.

12. The first device of claim 7, wherein causing the charged particle microscope to process the sample comprises one or more of: executing an application comprised in the application data to cause one or more operations, causing the charged particle microscope to perform one or more commands indicated in the application data to process the sample, causing the charged particle microscope to set one or more operational settings for processing the sample, or processing imaging data of the sample generated by the charged particle microscope.

13. A non-transitory computer-readable medium comprising a set of computer-executable instructions that, when executed by one or more processors, cause:
- determining, by a first device, an identifier associated with a sample;
- sending, to a second device, a request comprising the identifier, wherein the second device is configured to determine application data based on the identifier, wherein the application data comprises an application container comprising one or more applications;
- receiving, based on the request, the application data; and
- causing, based on the application data, a charged particle microscope to process the sample.

14. The non-transitory computer-readable medium of claim 13, wherein the first device comprises one or more of a computing device configured to operate the charged particle microscope or a computing device integrated into the charged particle microscope.

15. The non-transitory computer-readable medium of claim 13, wherein the identifier comprises one or more of a scannable code, a bar code, or a quick response code, and wherein the identifier is one or more of affixed to or integrated into a container of the sample.

16. The non-transitory computer-readable medium of claim 13, wherein determining the identifier comprises one or more of: determine the identifier based on user input or generating an image of at least a portion of the sample with the charged particle microscope and analyzing the image to determine the identifier.

17. The non-transitory computer-readable medium of claim 13, wherein causing the charged particle microscope to process the sample comprises one or more of processing the application data, unpackaging the application data, or using the application data to generate an application container.

* * * * *